US008878194B2

(12) United States Patent
Niwayama et al.

(10) Patent No.: US 8,878,194 B2
(45) Date of Patent: Nov. 4, 2014

(54) SEMICONDUCTOR ELEMENT, SEMICONDUCTOR DEVICE, AND SEMICONDUCTOR ELEMENT MANUFACTURING METHOD

(75) Inventors: Masahiko Niwayama, Kyoto (JP); Masao Uchida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/001,027

(22) PCT Filed: Sep. 3, 2012

(86) PCT No.: PCT/JP2012/005565
§ 371 (c)(1),
(2), (4) Date: Aug. 22, 2013

(87) PCT Pub. No.: WO2013/035300
PCT Pub. Date: Mar. 14, 2013

(65) Prior Publication Data
US 2013/0328065 A1    Dec. 12, 2013

(30) Foreign Application Priority Data
Sep. 7, 2011    (JP) ................... 2011-195208

(51) Int. Cl.
*H01L 29/16*    (2006.01)
*H01L 29/66*    (2006.01)
*H01L 21/04*    (2006.01)

(52) U.S. Cl.
CPC ...... *H01L 29/1608* (2013.01); *H01L 29/66068* (2013.01); *H01L 21/046* (2013.01)
USPC .............. 257/77; 257/329; 438/268; 438/289

(58) Field of Classification Search
CPC ............ H01L 21/046; H01L 29/66053; H01L 29/66068; H01L 29/66712; H01L 29/7827

USPC .............................. 257/77, 329; 438/268, 289
See application file for complete search history.

(56) References Cited

U.S. PATENT DOCUMENTS 7,981,817 B2    7/2011 Hashimoto et al.
2006/0267022 A1    11/2006 Mizukami et al.
(Continued)

FOREIGN PATENT DOCUMENTS

JP    2002-299625 A    10/2002
JP    2003/163351 A    6/2003
(Continued)

OTHER PUBLICATIONS

International Search Report for corresponding International Application No. PCT/JP2012/005565 mailed Nov. 13, 2012.

(Continued)

*Primary Examiner* — Matthew W Such
*Assistant Examiner* — Scott Stowe
(74) *Attorney, Agent, or Firm* — Renner, Otto, Boisselle & Sklar, LLP

(57) ABSTRACT

A method for fabricating a semiconductor element according to the present disclosure includes the steps of: (A) forming a first silicon carbide semiconductor layer of a first conductivity type on a semiconductor substrate; (B) forming a first mask to define a body region on the first silicon carbide semiconductor layer; (C) forming a body implanted region of a second conductivity type in the first silicon carbide semiconductor layer using the first mask; (D) forming a sidewall on side surfaces of the first mask; (E) defining a dopant implanted region of the first conductivity type and a first body implanted region of the second conductivity type in the first silicon carbide semiconductor layer using the first mask and the sidewall; and (F) thermally treating the first silicon carbide semiconductor layer.

12 Claims, 11 Drawing Sheets

(56) References Cited

U.S. PATENT DOCUMENTS

| | | |
|---|---|---|
| 2008/0224150 A1 | 9/2008 | Suzuki et al. |
| 2011/0207275 A1 | 8/2011 | Tanaka et al. |
| 2012/0057386 A1 | 3/2012 | Adachi et al. |
| 2012/0153303 A1 | 6/2012 | Uchida |

FOREIGN PATENT DOCUMENTS

| | | |
|---|---|---|
| JP | 2008-017237 A | 1/2008 |
| JP | 2008-227151 A | 9/2008 |
| JP | 2009-194165 A | 8/2009 |
| WO | WO 2008/057438 A2 | 5/2008 |
| WO | WO 2008/087763 A1 | 7/2008 |
| WO | WO 2010/125819 A1 | 11/2010 |
| WO | WO 2011/013364 A1 | 2/2011 |
| WO | WO 2011/027540 A1 | 3/2011 |

OTHER PUBLICATIONS

Preliminary Report on Patentability for corresponding International Application No. PCT/JP2012/005565 dated Apr. 2, 2013.

Yamashita et al., "Normally-off 4H-SiC Power MOSFET with Submicron Gate", Materials Science Forum, vols. 600-603 (2009), pp. 1115-1118.

Uchida et al., "Novel SiC Power MOSFET with Integrated Unipolar Internal Inverse MOS-Channel Diode", Electron Devices Meeting (IEDM), 2011 IEEE International, pp. 26.6.1-26.6.4.

(a)

US 8,878,194 B2

SEMICONDUCTOR ELEMENT, SEMICONDUCTOR DEVICE, AND SEMICONDUCTOR ELEMENT MANUFACTURING METHOD

TECHNICAL FIELD

The present application relates to a semiconductor element and more particularly relates to a silicon carbide semiconductor element (as a power semiconductor device) which can be used in applications that require a high breakdown voltage and a large amount of current.

BACKGROUND ART

Silicon carbide (SiC) is a high-hardness semiconductor material with a greater bandgap than silicon (Si), and has been used extensively in various types of semiconductor devices including power devices, hostile-environment devices, high temperature operating devices, and radio frequency devices. Among other things, the application of SiC to power devices such as switching devices and rectifiers has attracted a lot of attention. This is because a power device that uses SiC can significantly reduce the power loss compared to a Si power device. In addition, by utilizing such properties, SiC power devices can form a smaller semiconductor device than Si power devices.

A metal-insulator-semiconductor field effect transistor (MISFET) is a typical semiconductor element among various power devices that use SiC. In this description, an MISFET of SiC will be sometimes simply referred to herein as an "SiC-FET". And a metal-oxide-semiconductor field effect transistor (MISFET) is one of those MISFETs.

There have been reports that if a forward current is supplied to the pn junction of SiC, stacking faults will grow due to basal plane dislocations, which is a problem unique to SiC. Such a problem will arise when an SiC-FET is used as a switching device for power converters for driving and controlling a load such as a motor. If an SiC-FET is used as a switching device for power converters, then reverse current needs to flow when the SiC-FET is in OFF state. A pn junction inside an SiC-FET is sometimes used as a path for such reverse current. Since a pn junction is present within the semiconductor element and operates as a diode, such pn junction is called a "body diode". If the pn junction diode (body diode) of an SiC-FET is used as an inverse diode (freewheeling diode), then the diode current will flow in the forward direction of the pn junction diode. It is believed that if such current flows through the pn junction of SiC, then such bipolar operation will degrade the crystallinity of the SiC device, i.e., stacking faults grows at the pn junction (see, for example, Patent Document No. 1).

Degradation of crystallinity could impact the ON voltage of the body diode, raising it from its initial value. Also, if a body diode is used as an inverse diode, a reverse recovery current will flow due to the bipolar operation of the pn junction diode when the diode in ON state switches to OFF state. And that reverse recovery current causes not only recovery loss but also a decrease in switching rate as well.

Thus, in order to overcome such a problem involved by using a body diode as an inverse diode, it was proposed (in Patent Document No. 2, for example) that a reverse current is made to flow through an inverse diode element as an electronic part by connecting the inverse diode element and an SiC-FET in anti-parallel with each other.

CITATION LIST

Patent Literature

Patent Document No. 1: Japanese Laid-Open Patent Publication No. 2008-17237
Patent Document No. 2: Japanese Laid-Open Patent Publication No. 2002-299625
Patent Document No. 3: PCT International Application Publication No. 2010/125819

SUMMARY OF INVENTION

Technical Problem

According to the conventional technologies, however, an inverse diode element needs to be used separately from an SiC-FET, thus increasing the number of parts to be used and the manufacturing cost. A non-limiting exemplary embodiment of the present application provides an SiC semiconductor element that can maintain high reliability by checking the progress of deterioration in the crystallinity of an SiC semiconductor device without increasing the number of parts to be used.

Solution to Problem

A method for fabricating a semiconductor element according to an aspect of the present application includes the steps of: (A) forming a first silicon carbide semiconductor layer of a first conductivity type on a semiconductor substrate; (B) making a first mask to define a body region on the first silicon carbide semiconductor layer; (C) forming a body implanted region in the first silicon carbide semiconductor layer by implanting a dopant of a second conductivity type using the first mask; (D) forming a sidewall on side surfaces of the first mask; (E) implanting a dopant of the first conductivity type using the first mask and the sidewall to define a dopant implanted region in the first silicon carbide semiconductor layer and implanting a dopant of the second conductivity type to define a first body implanted region in the first silicon carbide semiconductor layer; and (F) thermally treating the first silicon carbide semiconductor layer to turn the dopant implanted region and the first body implanted region into a doped region and a first body region, respectively, define a second body region in a portion of the body implanted region other than the dopant implanted region and the first body implanted region and define a drift region in a portion of the first silicon carbide semiconductor layer other than the body implanted region.

A semiconductor element according to an aspect of the present application includes: a semiconductor substrate of a first conductivity type; a first silicon carbide semiconductor layer of the first conductivity type, which is located on the principal surface of the semiconductor substrate; a body region of a second conductivity type, which is located in the first silicon carbide semiconductor layer; a doped region of the first conductivity type, which is located in the body region; a second silicon carbide semiconductor layer of the first conductivity type, which is arranged on the first silicon carbide semiconductor layer so as to contact at least partially with the body region and the doped region; a gate insulating film on the second silicon carbide semiconductor layer; a gate electrode on the gate insulating film; a first ohmic electrode which is electrically connected to the doped region; and a second ohmic electrode which is arranged on the back surface of the semiconductor substrate. The body region includes a first body region and a second body region which is arranged at least under the first body region and which contacts with the bottom of the body region. The first body region has a higher dopant concentration than the second body region. And the doped region includes the dopant of the second conductivity type at a lower concentration than the first body region.

Advantageous Effects of Invention

According to an aspect of the present application, an SiC semiconductor element including a high reliability inverse diode, in which deterioration in crystallinity of its semiconductor layer is minimized, can be provided.

DESCRIPTION OF EMBODIMENTS

Figure 6:
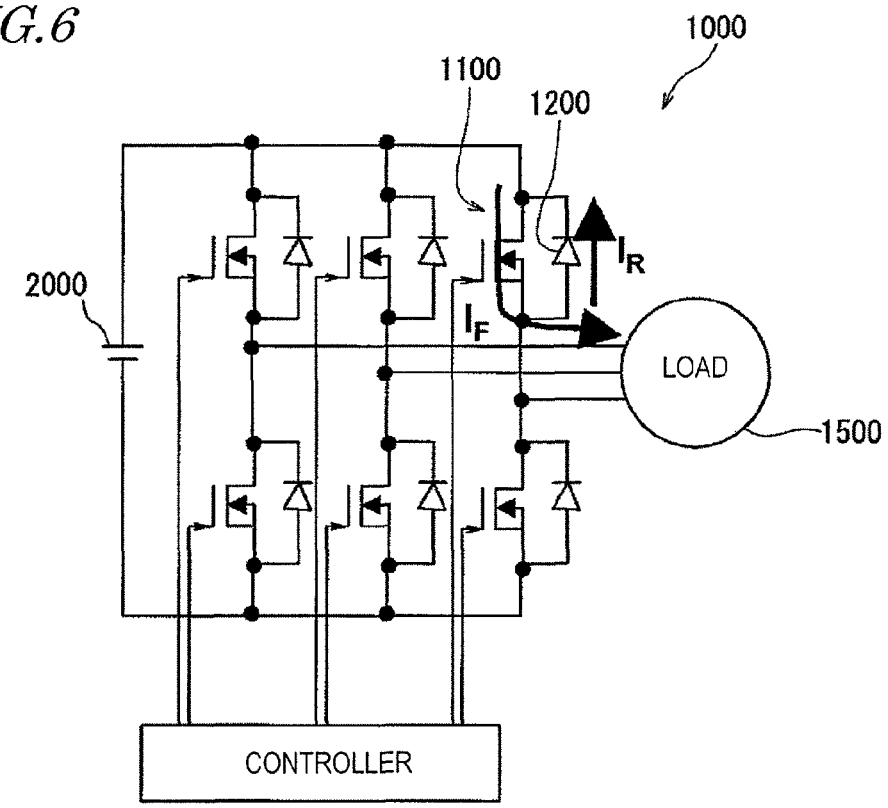
FIG. 6 is a circuit diagram illustrating a typical configuration for an inverter circuit 1000.

The present inventors carried out a detailed research on a circuit including SiC-FETs and inverse diodes connected in anti-parallel together as disclosed in Patent Document No. 2. FIG. 6 illustrates a configuration for a typical inverter circuit 1000 including such inverse diode elements.

The inverter circuit 1000 is a circuit for driving a load 1500 such as a motor and includes multiple semiconductor elements 1100 which are implemented as SiC-FETs. In this inverter circuit 1000, the semiconductor elements 1100 and inverse diode elements 1200 are connected in anti-parallel together. In this configuration, ON-state current $I_F$ flows through the semiconductor elements 1100 and reverse current $I_R$ flows through the inverse diode elements 1200. Two semiconductor elements 1100 that are connected in series together form one set of semiconductor elements. And in this example, three sets of semiconductor elements are arranged in parallel with each other with respect to a DC power supply 2000. The gate potential of each of these semiconductor elements 1100 is controlled by a controller.

Figure 7:
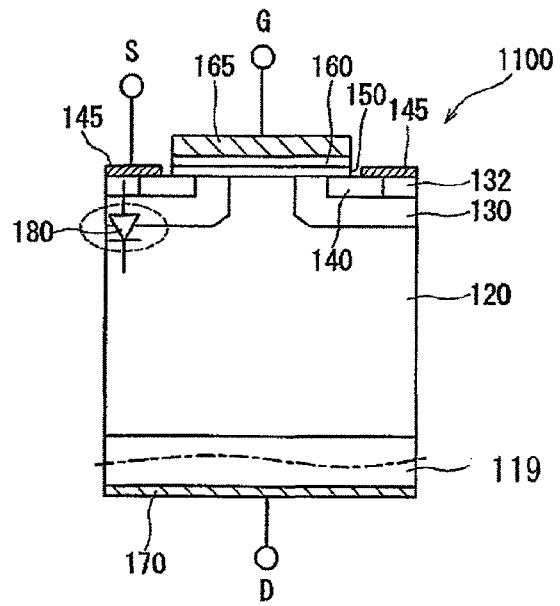
FIG. 7 is a cross-sectional view illustrating a semiconductor element (SIC-MISFET) 1100.

FIG. 7 illustrates the structure of a semiconductor element (SiC-FET) 1100. This semiconductor element 1100 is made of silicon carbide (SiC) semiconductors and has a structure in which an $n^-$-drift region 120 has been stacked on an $n^+$-substrate (SiC substrate) 110. A p-body region 130 has been defined in an upper part of the $n^-$-drift region 120. A p-body contact region 132 and an $n^+$ doped region 140 have been defined in an upper part of the p-body region 130. And a first ohmic electrode 145 is arranged on the p-body contact region 132 and the $n^+$-doped region 140.

An epitaxial channel layer 150 has been formed to cover the surface of the $n^-$-drift region 120, the p-body region 130 and the $n^+$-doped region 140. A gate insulating film 160 and a gate electrode 165 are further arranged on the epitaxial channel layer 150. A portion of the epitaxial channel layer 150, which contacts with the upper surface of the p-body region 130, functions as a channel region. On the back surface of the $n^+$-substrate 110, arranged is a second ohmic electrode 170.

A body diode 180 has been formed inside of this semiconductor element 1100. Specifically, the pn junction between the p-body region 130 and the $n^-$-drift region 120 forms the body diode 180.

Since SiC is a wide bandgap semiconductor, the body diode 180 has a relatively high turn-on voltage Vf of around 3 V (e.g., approximately 2.7 V) at room temperature and would cause a lot of loss. In this case, the turn-on voltage Vf is the potential Vsd of the first ohmic electrode 145 with respect to the potential of the second ohmic electrode 170.

Figure 8:
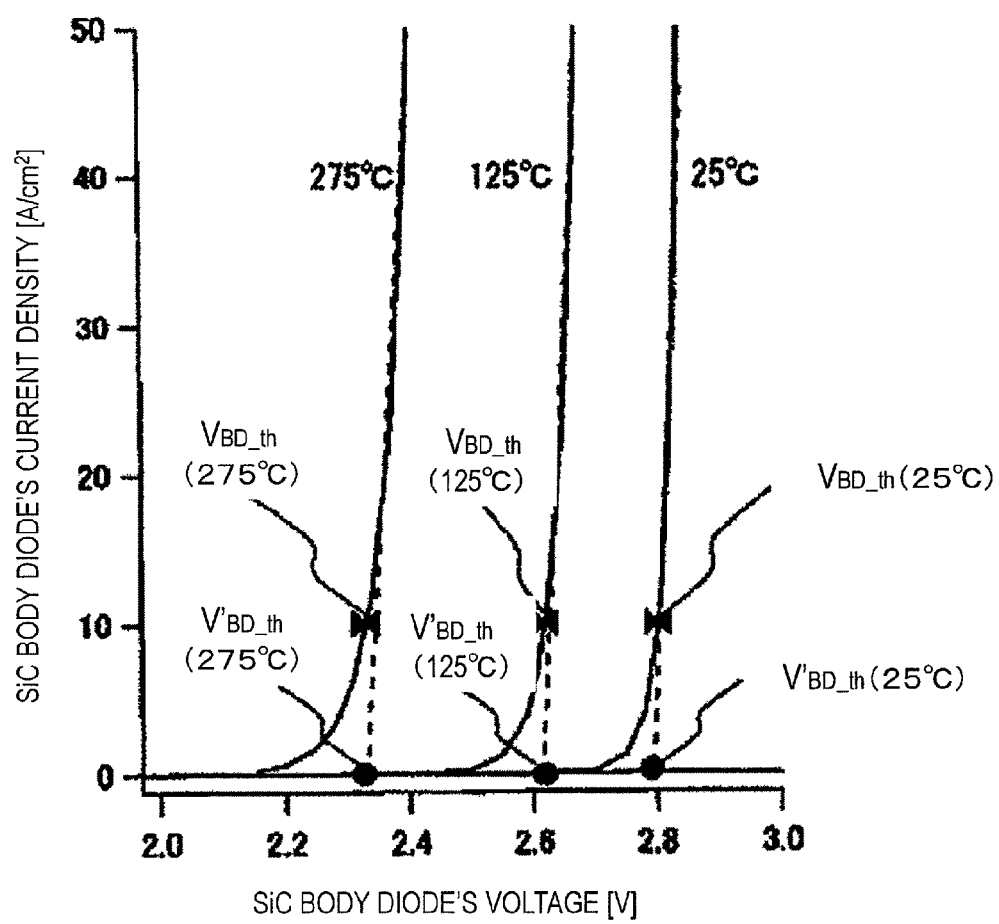
FIG. 8 is a graph showing turn-on voltages of an SiC body diode.

FIG. 8 shows the current-voltage characteristics and turn-on voltages of the body diode 180 at multiple different operating temperatures thereof. The turn-on voltage Vf of the body diode 180, which is obtained by making a tangential approximation on a curve representing its current-voltage characteristic, is as high as about 2.8 V at 25° C. A diode with such a high turn-on voltage is not practical. The higher the operating temperature, the smaller Vf. Also, as mentioned above, if the body diode 180 is used as an inverse diode, the degree of crystallinity of the semiconductor element 1100 will decrease, and the electrical resistance of the body diode 180 will increase, so will the loss, which is a problem.

For that reason, it is difficult to replace the inverse diode element 1200 of the inverter circuit 1000 with the body diode 180.

The body diode 180 is a pn junction diode and is also an element that is characterized by a bipolar operation. When the body diode 180 turns OFF, a reverse recovery current flows, which then results in recovery loss. As a result, as there is a period in which the reverse recovery current flows, it becomes very difficult to switch the semiconductor element 1100 at high rates. In addition, since the switching loss increases, it becomes difficult to increase the switching frequency, too.

Figure 9:
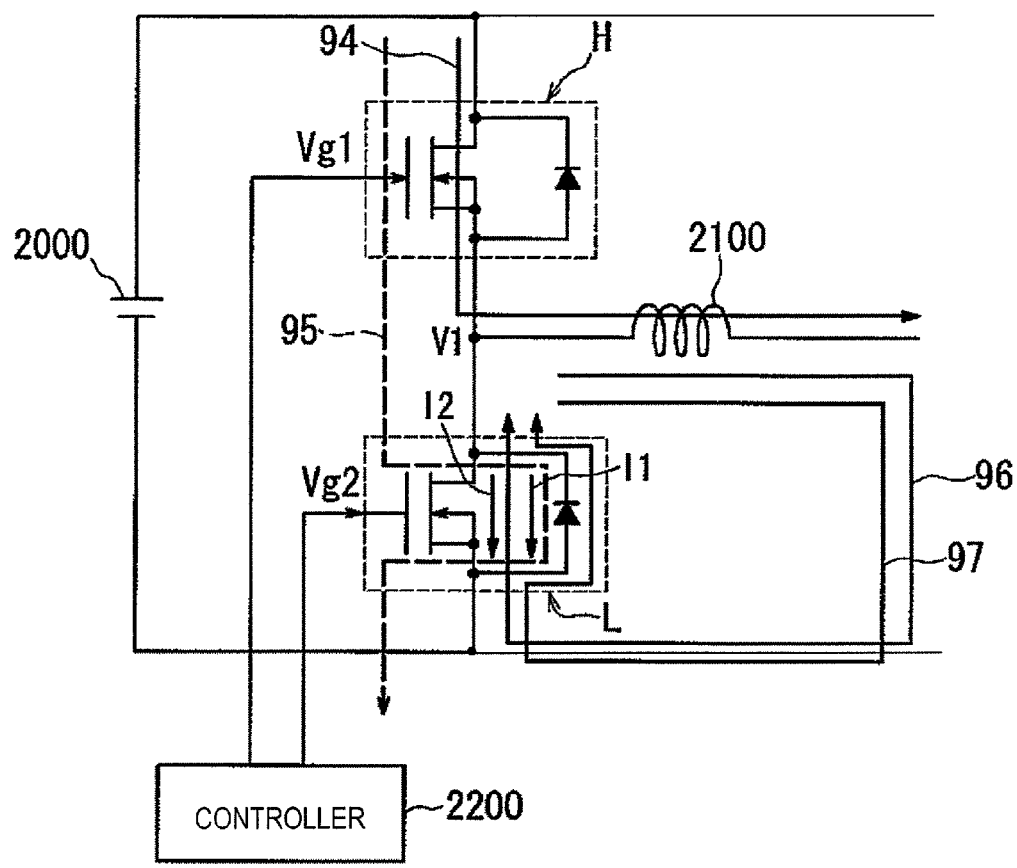
FIG. 9 is a circuit diagram illustrating a one-phase portion of the three-phase inverter of the inverter circuit shown in FIG. 6.

FIG. 9 is a circuit diagram illustrating a part of the configuration of the circuit shown in FIG. 6 for illustration purposes. In FIG. 9, the DC power supply 2000 supplies power to an inductive load 2100 such as a motor. A high-side MISFET H and a low-side MISFET L are connected in series together. A controller 2200 that drives the high-side MISFET H and the low-side MISFET L outputs a gate drive voltage Vg1 to the high-side MISFET H and a gate drive voltage Vg2 to the low-side MISFET L, respectively.

The controller 2200 and the DC power supply 2000 together function as a "potential setting section" for setting the potentials of respective MOSFETs (i.e., semiconductor elements). And the semiconductor device shown in FIG. 9 is driven by that potential setting section.

Each of the currents I1 and I2 indicated by the arrows in FIG. 9 is supposed to have a positive value when flowing in the direction indicated by the arrow and a negative value when flowing in the opposite direction to the one indicated by the arrow, respectively.

Figure 10:
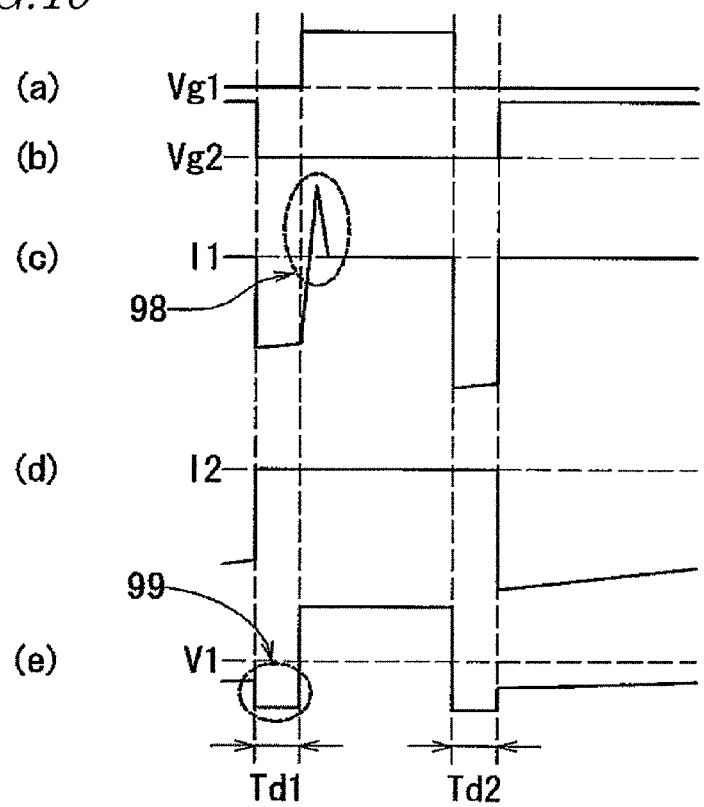
FIG. 10 is a timing diagram showing the operating waveforms of the circuit shown in FIG. 9.

Portions (a) through (e) of FIG. 10 show the operating waveforms of the circuit shown in FIG. 9 and illustrate a timing diagram showing voltages applied to, and currents flowing through, respective parts of the circuit when current needs to be supplied to the inductive load 2100.

The respective gate drive voltages Vg1 and Vg2 for the high-side MISFET H and the low-side MISFET L are turned ON and OFF exclusively. In addition, a dead time Td1, Td2 is provided between Vg1 and Vg2 to prevent the high-side and low-side MISFETs H and L from turning ON simultaneously and causing a short-circuit breakdown.

In the initial state indicated by the timing diagram shown in FIG. 10, Vg2 is in ON state to make a current flow in the path indicated by the arrow 96 shown in FIG. 9. Next, during the dead time Td1 after Vg2 has fallen to OFF state, current flows in the path indicated by the arrow 97 shown in FIG. 9. That is to say, the current flows through the inverse diode element that is connected anti-parallel to the low-side MISFET L. In that case, the current I1 has a negative value.

If the high-side MISFET H is turned ON while current is flowing through the inverse diode element that is connected anti-parallel to the low-side MISFET L, a voltage is applied to that inverse diode element that is connected anti-parallel to the low-side MISFET L. This voltage is a reverse voltage for the inverse diode element. That is why after a reverse recovery current has flowed through the inverse diode element that is connected anti-parallel to the low-side MISFET L along the path indicated by the arrow 95 shown in FIG. 9, that inverse diode that is connected anti-parallel to the low-side MISFET L turns OFF. More specifically, when the high-side MISFET H turns ON, the transient reverse recovery current, denoted as peak current 98, flows from the high-side MISFET H through the inverse diode element that is connected anti-parallel to the low-side MISFET L. This reverse recovery current never flows through the inductive load 2100. However, as indicated by the arrow 95 in FIG. 9, the reverse recovery current is superposed on the current flowing through the high-side MISFET H, thus causing an increase in switching loss, a breakdown of the element due to overcurrent, and a lot of noise.

When the inverse diode element that is connected anti-parallel to the low-side MISFET L turns OFF, current flows along the path indicated by the arrow 94 in FIG. 9. Next, during the dead time Td2 after Vg1 has fallen to OFF state, current flows along the path indicated by the arrow 97 shown in FIG. 9, i.e., through the inverse diode element that is connected anti-parallel to the low-side MISFET L.

When the low-side MISFET L turns ON while current is flowing through the inverse diode element that is connected anti-parallel to the low-side MISFET L, a channel current flows along the path indicated by the arrow 96 shown in FIG. 9, i.e., through the channel of the low-side MISFET L. As a result, the initial state is recovered. It should be noted that although the high-side MISFET H and the low-side MISFET L turn ON and OFF at mutually different times, the reverse recovery current is also generated on the high side, and therefore, current does flow through the inverse diode element on the high side.

Next, the reverse recovery current of a pn junction diode will be described with reference to FIG. 11, in which curves (a) and (b) show variations in the amount of current flowing through a pn junction diode of Si (which is labeled as Si-PND). Specifically, the curve (a) shows the results obtained at 25° C. ($T_j$=25° C.) and the curve (b) shows the results obtained at 150° C. ($T_j$=150° C.).

As indicated by these curves (a) and (b), a pn junction diode has a period in which a reverse recovery current is generated, thus deteriorating the performance of the inverter circuit 1000 (e.g., interfering with the high-rate switching and increasing the switching loss). The magnitude of the reverse recovery current indicated by the 150° C. curve (b) is greater than that of the reverse recovery current indicated by the 25° C. curve. That is why the higher the temperature, the more seriously the performance of the Si-pn junction diode is affected.

Figure 11:
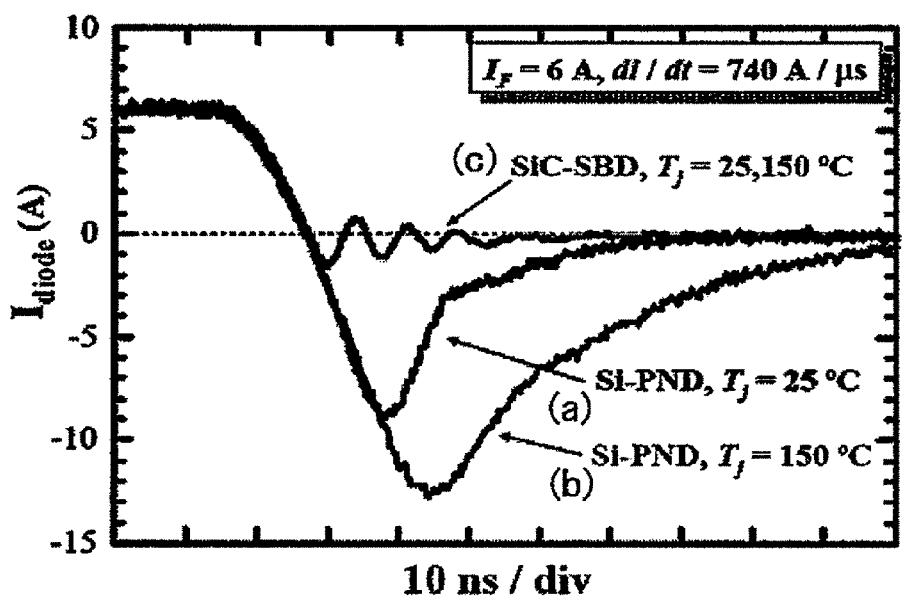
FIG. 11 is a graph showing how a reverse recovery current flows in a pn junction diode.

On the other hand, the curve (c) shown in FIG. 11 shows a variation in the amount of current flowing through a Schottky barrier diode of SiC (which is labeled as SiC-SBD). As indicated by the curve (c), the magnitude of the reverse recovery current generated in that case is smaller than what is indicated by the curve (a) or (b). In addition, since the curve (c) shows both of the results that were obtained at 25° C. and 150° C., it can be seen that almost no reverse recovery current is generated in the SiC-SBD even at high temperatures. For that reason, it is recommended that an SiC-SBD, rather than Si-PND, be used as the inverse diode element 1200. An SBD has a lower turn-on voltage than an SiC-FET body diode. That is why if the amount of reverse current is small, then the reverse current will flow through the SBD and will not flow through the body diode. As a result, the degradation in crystallinity of the SiC-FET can be minimized. That is to say, if the SiC-SBD is connected in anti-parallel with the SiC-FET, a high-reliability FET that can make the reverse current flow is realized.

However, if an SiC SBD is used as the inverse diode element, the circuit cost should increase because silicon carbide semiconductor materials themselves, and therefore SiC SBDs, are too expensive. Furthermore, if the SiC-FET disclosed in Patent Document No. 2 is used to make a power converter, the failure rate of the SiC-FET will increase when reverse current flows through the body diode. Thus, it cannot be said that the reliability of such a power converter is high. On top of that, since the number of components to use increases by introducing the SiC-SBD, the power converter comes to have an increased size, which is contrary to the recent downsizing and weight reduction trends of power converters.

Thus, the present inventors provide novel semiconductor element, semiconductor device and method for fabricating the element that would contribute to overcoming these problems.

An aspect of the present invention is outlined as follows:

A method for fabricating a semiconductor element according to an aspect of the present invention includes the steps of: (A) forming a first silicon carbide semiconductor layer of a first conductivity type on a semiconductor substrate; (B) making a first mask to define a body region on the first silicon carbide semiconductor layer; (C) forming a body implanted region in the first silicon carbide semiconductor layer by implanting a dopant of a second conductivity type using the first mask; (D) forming a sidewall on side surfaces of the first mask; (E) implanting a dopant of the first conductivity type using the first mask and the sidewall to define a dopant implanted region in the first silicon carbide semiconductor layer and implanting a dopant of the second conductivity type to define a first body implanted region in the first silicon carbide semiconductor layer; and (F) thermally treating the first silicon carbide semiconductor layer to turn the dopant implanted region and the first body implanted region into a doped region and a first body region, respectively, define a second body region in a portion of the body implanted region other than the dopant implanted region and the first body implanted region and define a drift region in a portion of the first silicon carbide semiconductor layer other than the body implanted region.

The step (E) may include implanting the dopant of the second conductivity type so that the dopant of the second conductivity type is located deeper than the dopant implanted region in the body implanted region.

Each of the first and second body regions has a bottom portion and a wall portion. In the first silicon carbide semiconductor layer, the doped region is located in a surface region of the first silicon carbide semiconductor layer. The bottom portion of the first body region is located under the doped region and the wall portion of the first body region is located beside the doped region and contacts with the surface of the first silicon carbide semiconductor layer. The bottom portion of the second body region is located under the bottom portion of the first body region and the wall portion of the second body region is located outside of the wall portion of the first body region.

The method may further include, before the step (F), the step of forming a contact implanted region that at least reaches the bottom portion of the first body region in the dopant implanted region. The step (F) may include turning the contact implanted region into a contact region.

The method may further include, after the step (F), the steps of: forming a second silicon carbide semiconductor layer on the surface of the first silicon carbide semiconductor layer; forming a gate insulating film on the second silicon carbide semiconductor layer; forming a gate electrode on the gate insulating film; removing respective parts of the gate insulating film and the second silicon carbide semiconductor layer so that a part of the doped region and the contact region are exposed; forming a first ohmic electrode so that the first ohmic electrode contacts with the exposed part of the doped region and with the contact region; and forming a second ohmic electrode in contact with the other surface of the semiconductor substrate with which the first silicon carbide semiconductor layer does not contact.

The steps (A), (B), (D), (E), (C) and (F) may be performed in this order, and the method may further include, between the steps (E) and (C), the step of removing the sidewall.

A semiconductor element according to another aspect of the present invention includes: a semiconductor substrate of a first conductivity type; a first silicon carbide semiconductor layer of the first conductivity type, which is located on the principal surface of the semiconductor substrate; a body region of a second conductivity type, which is located in the first silicon carbide semiconductor layer; a doped region of the first conductivity type, which is located in the body region; a second silicon carbide semiconductor layer of the first conductivity type, which is arranged on the first silicon carbide semiconductor layer so as to contact at least partially with the body region and the doped region; a gate insulating film on the second silicon carbide semiconductor layer; a gate electrode on the gate insulating film; a first ohmic electrode which is electrically connected to the doped region; and a second ohmic electrode which is arranged on the back surface of the semiconductor substrate. The body region includes a first body region and a second body region which is arranged at least under the first body region and which contacts with the bottom of the body region. The first body region has a higher dopant concentration than the second body region. And the doped region includes the dopant of the second conductivity type at a lower concentration than the first body region.

The first and second body regions may have thicknesses of 15 nm and 100 nm, respectively, as measured perpendicularly to the principal surface of the semiconductor substrate, and the dopant concentration of the first body region may be twice or more as high as that of the second body region.

The first body region may be located under the bottom of the doped region and beside the doped region and may contact with the surface of the first silicon carbide semiconductor layer beside the doped region.

A portion of the first body region that contacts with the second silicon carbide semiconductor layer may be arranged shallower than another portion of the first body region that is located under the doped region.

Each of the first and second body regions may have a bottom portion and a wall portion. In the first silicon carbide semiconductor layer, the doped region may be located in a surface region of the first silicon carbide semiconductor layer, the bottom portion of the first body region may be located under the doped region and the wall portion of the first body region may be located beside the doped region and may contact with the surface of the first silicon carbide semiconductor layer. And the bottom portion of the second body region may be located under the bottom portion of the first body region and the wall portion of the second body region may be located outside of the wall portion of the first body region.

Supposing potentials applied to the second ohmic electrode and the gate electrode are Vds and Vgs, respectively, with respect to the first ohmic electrode and a gate threshold voltage is Vth, if Vgs≥Vth is satisfied, current may flow from the second ohmic electrode toward the first ohmic electrode through the second silicon carbide semiconductor layer. And if 0 volts≤Vgs<Vth is satisfied, as Vds decreases to be less than 0 volts, current may flow from the first ohmic electrode toward the second ohmic electrode through the second silicon carbide semiconductor layer before current starts to flow from the body region toward the first silicon carbide semiconductor layer.

The semiconductor substrate, the first silicon carbide semiconductor layer, the body region, the doped region, the second silicon carbide semiconductor layer, the gate insulating film, the gate electrode, the first ohmic electrode, and the second ohmic electrode may together form a metal-insulator-semiconductor field effect transistor. Supposing the potential of the second ohmic electrode with respect to the potential of the first ohmic electrode is Vds, the potential of the gate electrode with respect to the potential of the first ohmic electrode is Vgs, the gate threshold voltage of the metal-insulator-semiconductor field effect transistor is Vth, the direction of current flowing from the second ohmic electrode toward the first ohmic electrode is defined to be a forward direction, and the direction of current flowing from the first ohmic electrode toward the second ohmic electrode is defined to be a reverse direction, if Vgs≥Vth is satisfied, then the metal-insulator-semiconductor field effect transistor may make the second and first ohmic electrodes electrically conductive with each other via the second silicon carbide semiconductor layer.

If 0 volts≤Vgs<Vth is satisfied, then the metal-insulator-semiconductor field effect transistor may function as a diode which allows no current to flow in the forward direction but which allows current to flow in the reverse direction from the first ohmic electrode toward the second ohmic electrode via the second silicon carbide semiconductor layer when Vds<0 volts. The absolute value of a turn-on voltage of the diode may be smaller than the absolute value of a turn-on voltage of a body diode formed by the body region and the first silicon carbide semiconductor layer.

The first body region may have a dopant concentration of $1 \times 10^{18}$ cm$^{-3}$ to $1 \times 10^{20}$ cm$^{-3}$ and the second body region may have a dopant concentration of $1 \times 10^{17}$ cm$^{-3}$ to $1 \times 10^{19}$ cm$^{-3}$.

The second silicon carbide semiconductor layer may be electrically connected to the doped region and a portion of the first silicon carbide semiconductor layer which is adjacent to the second body region and may be arranged on the first body region.

The second silicon carbide semiconductor layer may have been epitaxially grown.

A semiconductor device according to another aspect of the present invention includes a plurality of semiconductor elements according to any of the embodiments described above. The respective semiconductor substrates and respective first silicon carbide semiconductor layers of those semiconductor elements are connected together. A ring region of the second conductivity type is arranged in the first silicon carbide semiconductor layer so as to surround those semiconductor elements in a plane that is parallel to the principal surface of the semiconductor substrate. The ring region and the body region have the same dopant concentration profile in a depth direction.

According to an aspect of the present invention, by forming the body region of two regions, a first body region that adjusts the threshold value of the semiconductor element and a second body region that forms a pn junction with a drift region can have their concentrations controlled independently of each other. Thus, a decrease in the breakdown voltage of the semiconductor element or a leakage failure thereof can be minimized. Since the dopant concentration of a dopant of a second conductivity type is lower in a doped region of a first conductivity type than in the first body region, it is possible to prevent the effective concentration of the dopant of the first conductivity type in the doped region from being affected by the dopant of the second conductivity type and the concentration of the doped region of the first conductivity type does not decrease easily. In addition, the concentration of the dopant of the first conductivity type in the doped region can be controlled more easily, and the variation in dopant concentration can be reduced as well. Consequently, an increase in the ON-state resistance of the semiconductor element, and eventually a variation in its performance, can be minimized.

Hereinafter, embodiments of a semiconductor element according to the present invention will be described in detail with reference to the accompanying drawings. A semiconductor element according to an embodiment to be described below includes a MISFET which is comprised of a silicon carbide semiconductor layer functioning as a channel region, a gate electrode that controls current flowing through the silicon carbide semiconductor layer, and first and second ohmic electrodes that are electrically connected to the silicon carbide semiconductor layer. If the potential of the gate electrode with respect to the potential of the first ohmic electrode is equal to or greater than zero but less than the threshold voltage Vth of the transistor, this MISFET functions as a diode that makes current flow from the first ohmic electrode toward the second ohmic electrode via the channel region.

In this description, the potential of the second ohmic electrode D with respect to the potential of the first ohmic electrode S will be identified herein by Vds. The potential of the gate electrode G with respect to the potential of the first ohmic electrode S will be identified herein by Vgs. The direction of current flowing from the second ohmic electrode D toward the first ohmic electrode S is defined to be a "forward direction". And the direction of current flowing from the first ohmic electrode S toward the second ohmic electrode D is defined to be a "reverse direction". It should be noted that both potentials and voltages are expressed in volts (V).

(Embodiment 1)

Figure 1:
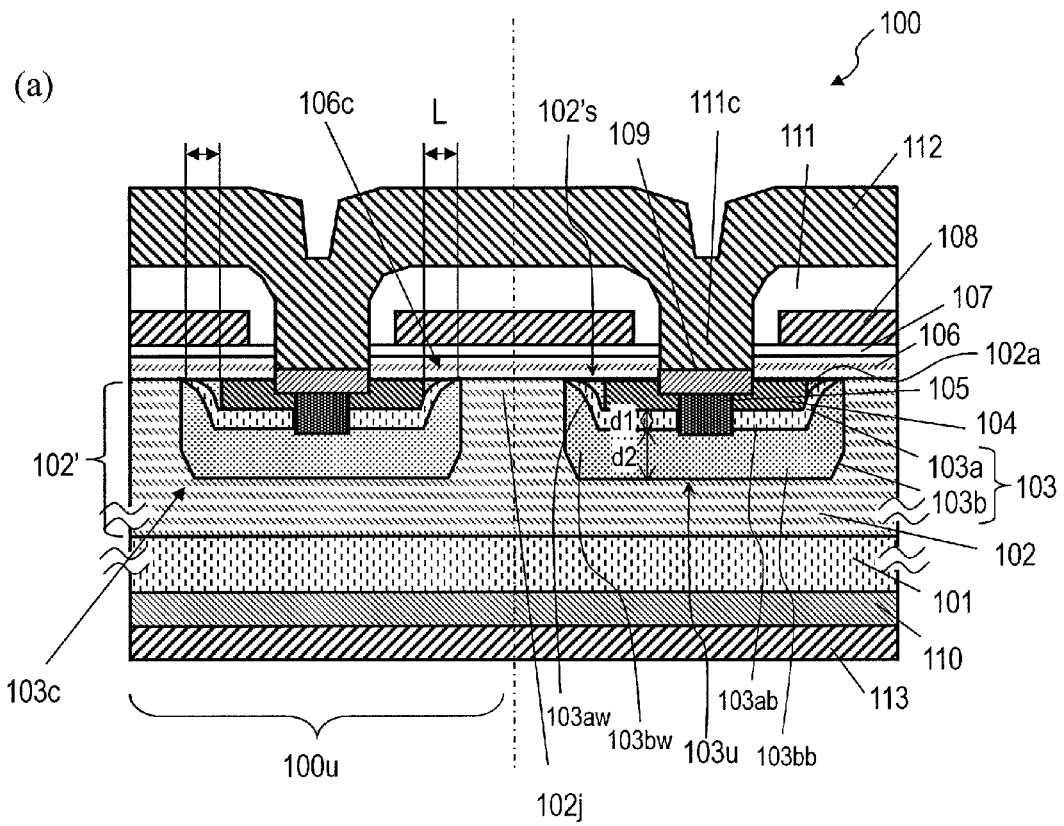
FIG. 1(a) is a cross-sectional view illustrating a first embodiment of a semiconductor element and FIGS. 1(b) and 1(c) are schematic representations illustrating the arrangement of unit cells.
Figure 1:
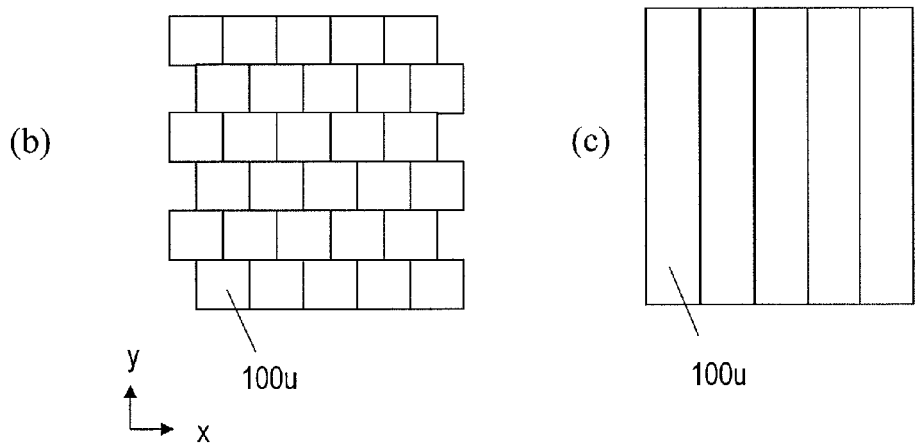

Hereinafter, a first embodiment of a semiconductor element will be described with reference to the accompanying drawings. FIG. 1(a) schematically illustrates a cross section of a semiconductor element 100 as a first embodiment. In FIG. 1(a), a cross section of two semiconductor elements 100, which are respectively located on the right- and left-hand sides of the one-dot chain, is illustrated. These two semiconductor elements 100 form a unit cell 100u. Any retailed semiconductor device has a number of such unit cells.

The semiconductor element 100 includes a semiconductor substrate 101 of a first conductivity type and a first silicon carbide semiconductor layer 102' of the first conductivity type, which has been formed on the principal surface of the semiconductor substrate 101. In this embodiment, the first conductivity type is n type and the second conductivity type is p type. But the first and second conductivity types may also be p and n types, respectively. The semiconductor substrate 101 has n$^+$ conductivity and is made of silicon carbide. The first silicon carbide semiconductor layer 102' is of n$^-$ type. It should be noted that the superscript "+" or "−" added to the conductivity type "n" or "p" represents the relative concentration of the dopant introduced. That is to say, "n$^+$" means that the concentration of an n-type dopant added is higher than "n", while "n$^-$" means that the concentration of an n-type dopant added is lower than "n".

In the first silicon carbide semiconductor layer 102', defined is a body region 103 of the second conductivity type. The rest of the first silicon carbide semiconductor layer 102' other than the body region 103 will be referred to herein as a "drift region 102". In the body region 103, there is a doped region 104 of the first conductivity type which contacts with the surface 102's of the first silicon carbide semiconductor layer 102'.

The body region 103 includes a first body region 103a of the second conductivity type and a second body region 103b of the second conductivity type. The first body region 103a includes a bottom portion 103ab which is located under the doped region 104 and a wall portion 103aw which is located beside the doped region 104. That is to say, the first body region 103a is located under and beside the doped region 104 and contacts with the surface 102's of the first silicon carbide semiconductor layer beside the doped region 104. The second body region 103b is in contact with the bottom 103u of the body region 103, and includes a bottom portion 103bb which is located under the bottom portion 103ab of the first body region 103a and a wall portion 103bw which is located beside the wall portion 103aw of the first body region 103a.

As measured perpendicularly to the principal surface of the semiconductor substrate 101, the first and second body regions 103a and 103b have thicknesses of at least 15 nm and at least 100 nm, respectively, below the doped region 104. As shown in FIG. 1(a), the second body region 103b includes a wall portion 103bw which runs from below the doped region 104 to reach the surface 102's of the first silicon carbide semiconductor layer 102' so as to cover the first body region 103a and the doped region 104. The thickness of the wall portion 103bw decreases from below the doped region 104 toward the surface 102's of the first silicon carbide semiconductor layer 102'. On the other hand, the first body region 103a also includes a wall portion 103aw which runs from below the doped region 104 to reach the surface 102's of the first silicon carbide semiconductor layer 102' so as to cover the doped region 104.

As can be seen, the first body region 103a is located in the second body region 103b so as to be surrounded with the wall portion 103bw of the second body region 103b, and does not contact with the drift region 102. Meanwhile, the doped region 104 is located in the first body region 103a so as to be surrounded with the wall portion 13aw of the first body region 103a. When viewed perpendicularly to the principal surface of the semiconductor substrate 101, the first body region 103a is distributed in the second body region 103b so that the outer periphery of the first body region 103a expands toward the surface.

In this embodiment, a region 102a which contacts with the surface 102's of the first silicon carbide semiconductor layer 102' and the side surface of the doped region 104 is located between the wall portion 103aw of the first body region 103a and the doped region 104. In this embodiment, this region 102a, as well as the drift region 102, has the second conductivity type, and includes a dopant of the second conductivity type at approximately the same concentration. However, the region 102a may also include a dopant of the second conductivity type at as high a concentration as the first body region 103a. Also, the first body region 103a is of $p^+$ type and the second body region 103b is of p-type. The dopant concentration of the first body region 103a may be twice or more as high as that of the second body region 103b. In this case, the dopant concentrations of the first and second body regions 103a and 103b are supposed to be compared to each other where the first and second body regions 103a and 103b are adjacent to each other.

As will be described in detail later, the first body region 103a is defined by implanting a dopant to a deeper level than the doped region 104 using a mask with a sidewall to define the doped region 104. That is why the dopant concentration of the dopant of the second conductivity type is lower in the doped region 104 than in the first body region 103a. In this case, the dopant concentrations of the dopant of the second conductivity type in the doped region 104 and the first body region 103a are supposed to be compared to each other at the same depth in the first silicon carbide semiconductor layer 102'. In this process step, below the sidewall, the dopant to define the first body region 103a remains at a relatively shallow level in the first silicon carbide semiconductor layer 102' because the dopant has passed through the sidewall. As a result, the wall portion 103aw of the first body region 103a is formed to contact with the surface 102's of the first silicon carbide semiconductor layer 102'.

Since the dopant concentration of the dopant of the second conductivity type is lower in the doped region 104 than in the first body region, the dose of the dopant of the first conductivity type that needs to be added to turn the conductivity type of the doped region 104 into the first conductivity type may be small. As a result, a heavily doped region 104 can be defined easily. In addition, the dopant concentration of the dopant of the first conductivity type can also be controlled more easily, and the variation in the element's characteristic can be minimized.

The semiconductor element 100 may further include a contact region 105 of the second conductivity type, which runs through the first body region 103a to contact with the second body region 103b in the doped region 104. The contact region 105 may be of $p^+$ type. A first ohmic electrode 109 has been formed over the doped region 104. The first ohmic electrode 109 covers the respective surfaces of, and is electrically in contact with, both of the doped region 104 and the contact region 105. If the first body region 103a has a sufficiently high dopant concentration, then the contact region 105 may be omitted. In that case, a contact trench may be cut through the doped region 104 so as to expose the first body region 103a and be filled with the first ohmic electrode 109, thereby making the first body region 103a and the first ohmic electrode 109 contact directly with each other.

A portion 102j of the drift region 102 which is adjacent to the body region 103 (i.e., the region 102j interposed between the respective body regions 103 of two adjacent unit cells) will be referred to herein as a JFET (junction field-effect transistor) region for the sake of simplicity of description. As this region forms part of the first silicon carbide semiconductor layer 102', its dopant concentration may be as high as that of the first silicon carbide semiconductor layer 102'. However, in order to reduce the resistance in the JFET region 102j, a dopant of the first conductivity type (which is n-type in this example) may be introduced into that region by ion implantation, for example, and the region 102j may have a higher dopant concentration than the first silicon carbide semiconductor layer 102'.

On the first silicon carbide semiconductor layer 102', arranged is a second silicon carbide semiconductor layer 106 of the first conductivity type, which partially in contact with the body region 103 and the doped region 104. In the doped region 104 and the first silicon carbide semiconductor layer 102', the second silicon carbide semiconductor layer 106 may be electrically connected to the JFET region 102j that is adjacent to the second body region 103b and may be located over the first body region 103a. More specifically, in the first body region 103a, part of the wall portion 103aw contacts with the second silicon carbide semiconductor layer 106. The wall portion 103aw is arranged at a shallower level in the first silicon carbide semiconductor layer 102' than its bottom portion 103ab.

In this embodiment, the second silicon carbide semiconductor layer 106 is epitaxially grown. The second silicon carbide semiconductor layer 106 has a channel region 106c in its portion that is in contact with the first body region 103a. The length of the channel region 106c (which will be referred to herein as a "channel length L") is as indicated by each of the two double-headed arrows shown in FIG. 1(a). That is to say, the "channel length" of the MISFET is defined by a horizontal size measured on the upper surface of the first body region 103a (i.e., the surface that contacts with the second silicon carbide semiconductor layer 106) on the paper.

A gate insulating film 107 has been formed on the second silicon carbide semiconductor layer 106. A gate electrode 108 is arranged on the gate insulating film 107. The gate electrode 108 is located over the channel region 106c to say the least.

An interlevel dielectric film 111 has been deposited over the gate electrode 108, and an upper interconnect electrode 112 is stacked on the interlevel dielectric film 111. The upper interconnect electrode 112 is connected to the first ohmic electrode 109 through a contact hole 111c that has been cut through the interlevel dielectric film 111. On the back surface of the semiconductor substrate 101, arranged is a second ohmic electrode 110. And a back surface interconnect electrode 113 is further stacked on the back surface of the second ohmic electrode 110.

When the semiconductor element 100 is viewed from over the upper interconnect electrode 112, each unit cell 100u of the semiconductor element 100 may have a square shape, for example. Alternatively, the unit cell 100u may also have a rectangular shape, a quadrilateral shape or any other polygonal shape as well. FIG. 1(b) illustrates an arrangement of unit cells 100u. As shown in FIG. 1(b), the unit cells 100u are arranged two-dimensionally in x and y directions, and rows of unit cells shift alternately by a half pitch in the y direction. If the unit cells 100u have a shape that is elongated in one direction, then the unit cells 100u may also be arranged in parallel as shown in FIG. 1(c). A semiconductor device is formed by a number of unit cells 100c that are arranged in this manner.

Next, it will be described how this semiconductor element 100 operates. In the semiconductor element 100, the second silicon carbide semiconductor layer 106, the gate electrode 108 that controls the amount of current flowing through the second silicon carbide semiconductor layer 106, the gate insulating film 107, and the first and second ohmic electrodes 109 and 110 that are electrically connected to the second silicon carbide semiconductor layer 106 together form a MISFET. Supposing the threshold voltage of the MISFET (i.e., the threshold voltage of the forward current) is Vth, the MISFET turns ON if Vgs≥Vth is satisfied. On the other hand, if Vds>0 V is satisfied, current flows from the second ohmic electrode 110 toward the first ohmic electrode 109 through the second silicon carbide semiconductor layer 106. On the other hand, if Vgs<Vth is satisfied, the transistor turns OFF.

If 0 V≤Vgs<Vth and Vds<0 V are satisfied, this MISFET can function, even in OFF state, as a diode that makes current flow from the first ohmic electrode 109 toward the second ohmic electrode 110 through the second silicon carbide semiconductor layer 106 by appropriately setting the respective dopant concentrations of the first body region 103a and the second silicon carbide semiconductor layer 106 and the thickness of the second silicon carbide semiconductor layer 106. In this description, such a diode that makes current flow from the first ohmic electrode 109 toward the second ohmic electrode 110 through the second silicon carbide semiconductor layer 106 will be referred to herein as a "channel diode". Since the direction of current flowing from the second ohmic electrode 110 toward the first ohmic electrode 109 is defined herein to be the "forward direction" and the direction of current flowing from the first ohmic electrode 109 to the second ohmic electrode 110 is defined herein to be the "reverse direction", it is in the "reverse direction" that this diode makes current flow.

This channel diode that uses the channel region of the MISFET as a current path has such a characteristic that does not make a current of 1 mA or more flow if Vds>Vf0 (where Vf0 is a negative value) is satisfied but does make a current of 1 mA or more flow if Vds≤Vf0 is satisfied. In other words, the current that flows through this diode is almost zero (i.e., less than 1 mA) if Vds>Vf0 (where Vf0 is a negative value) is satisfied. However, as Vds is gradually decreased from zero (i.e., as the absolute value of Vds is gradually increased), Vds will soon get equal to Vf0, when this diode will start to make a current of 1 mA flow. And as the absolute value of Vds is further increased, the amount of the current flowing will further increase. In this sense, Vf0 corresponds to the "turn-on voltage" as defined in the current-voltage characteristic of a diode.

Both the turn-on voltage Vf0 of the diode and the threshold voltage Vth of the transistor are determined mainly by the dopant concentration of the first body region 103a, the dopant concentration and thickness of the second silicon carbide semiconductor layer 106 and the thickness of the gate insulating film 107.

Figure 2A:
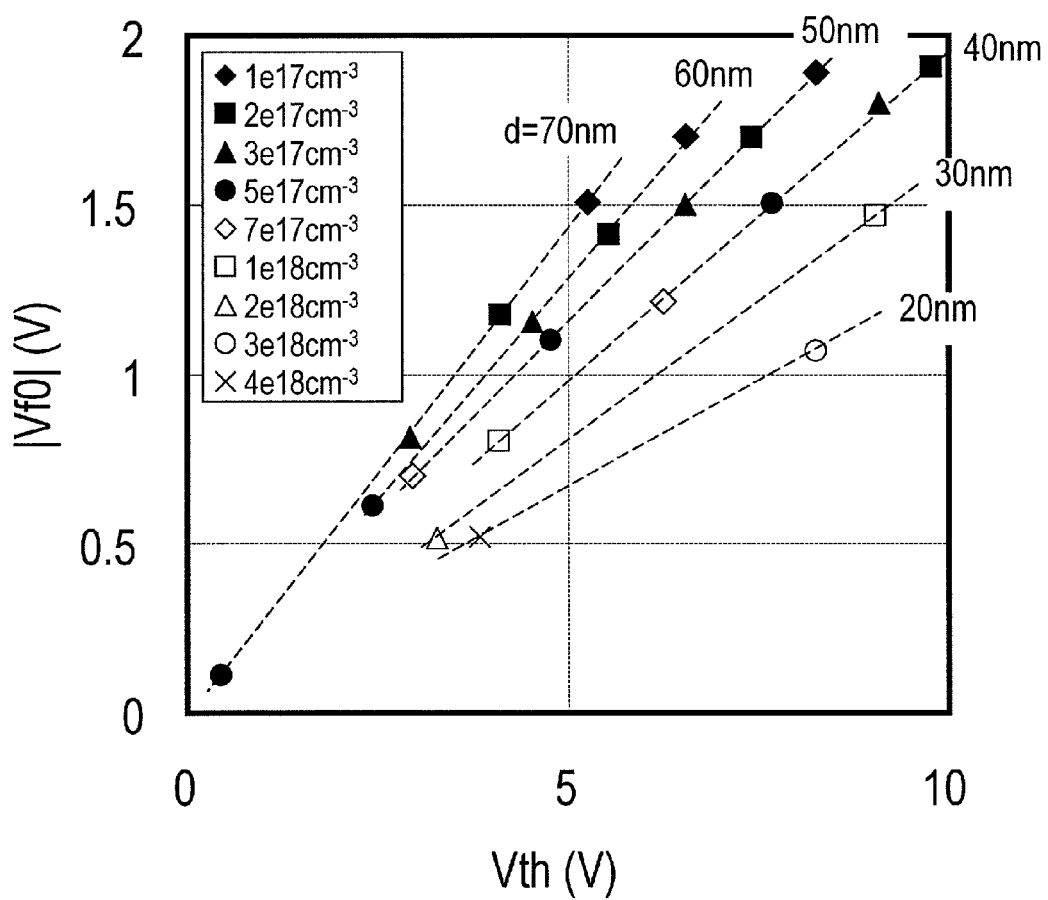
FIG. 2A is a graph showing how the threshold voltage Vth of the semiconductor element 100 shown in FIG. 1 and the turn-on voltage |Vf0| of the channel diode change with the dopant concentration and thickness of the second silicon carbide semiconductor layer 106 in the semiconductor element 100.

The semiconductor element 100 of this embodiment can control Vth and Vf0 independently of each other. FIG. 2A shows the results of simulations indicating how the threshold voltage Vth of the transistor and the absolute value of the turn-on voltage of the channel diode |Vf0| change with the dopant concentration and thickness of the second silicon carbide semiconductor layer 106 in a situation where the thickness of the gate insulating film 107 is set to be 70 nm and the dopant concentration of the first body region 103a is set to be $1\times10^{19}$ cm$^{-3}$ as an example. As can be seen from FIG. 2A, in a situation where the absolute value |Vf0| of the turn-on voltage Vf0 of the channel diode should be about 1 V, if the dopant concentration and thickness of the second silicon carbide semiconductor layer 106 are set to be approximately $2.5\times10^{17}$ cm$^{-3}$ and approximately 70 nm, respectively, then the semiconductor element 100 has a Vth of about 3.5 V. On the other hand, if the dopant concentration and thickness of the second silicon carbide semiconductor layer 106 are set to be approximately $1.5\times10^{18}$ cm$^{-3}$ and approximately 30 nm, respectively, then Vth of the semiconductor element 100 can be set to be approximately 6.1 V with a |Vf0| of approximately 1 V maintained.

The semiconductor element 100 of this embodiment can raise both the dopant concentration in the surface region of the body region 103 (i.e., in the first body region 103a) and the dopant concentration in the second silicon carbide semiconductor layer 106. As a result, the absolute value of Vf0 can be smaller than the absolute value of Vf at which current starts to flow through the body diode that is formed by the drift region 102 and the second body region 103b. And when 0 V≤Vgs<Vth and Vds<0 V are satisfied, current can flow through the channel diode before starting to flow through the body diode.

On the other hand, the breakdown voltage of the semiconductor element 100 is determined by the pn junction that is formed by the second body region 103b and the drift region 102 (i.e., the first silicon carbide semiconductor layer 102').

In a situation where the body region 103 has a high dopant concentration, if a bias voltage that is positive with respect to the second ohmic electrode 110 is applied to the first ohmic electrode 109, a voltage in the reverse direction will be applied to the pn junction that is formed by the body region 103 and the drift region 102. As a result, the intensity of the electric field becomes locally high at their interface. In this case, the higher the concentration of the body region 103, the more likely the electric field intensity gets locally high. Among other things, the intensity of the electric field easily gets particularly high at a corner 103c of the body region 103 as shown in FIG. 1(a), thus determining the breakdown voltage of the semiconductor element 100. That is to say, the lower the concentration of the p-type dopant at the corner 103c, the higher the breakdown voltage of the semiconductor element 100 can be kept. Conversely, the higher the concentration of the dopant there, the lower the breakdown voltage gets. On top of that, the dopant in the body region 103 has been mostly introduced there by implanting ions of the dopant into silicon carbide and those ions of the dopant that have been implanted into the silicon carbide cannot be activated so perfectly as in the Si semiconductor. That is why the higher the dopant concentration in the body region 103, the more significant the influence of implant damage that has not quite been repaired in the body region 103 and the more likely leakage current will be generated. For that reason, from this point of view, the concentration in a portion of the body region 103 that contacts with the drift region 102 is suitably somewhat low. In this embodiment, the first body region 103a with the higher dopant concentration is located in the second body region 103b and only the second body region 103b, of which the concentration can be reduced, contacts with the drift region 102. Consequently, various inconveniences to be caused if the body region has a high concentration can be reduced significantly.

In the semiconductor element 100 of this embodiment, the body region 103 is split into the first and second body regions 103a and 103b, of which the dopant concentrations can be controlled independently of each other. That is to say, on the one hand, the turn-on voltage Vf0 of the diode can be controlled by adjusting the dopant concentration of the first body region 103a. On the other hand, the breakdown voltage of the semiconductor element 100 can be controlled by adjusting the dopant concentration of the second body region 103b. For example, the first body region 103a may have a dopant concentration of $1\times10^{18}$ cm$^{-3}$ to $1\times10^{20}$ cm$^{-3}$ and the second body region 103b may have a dopant concentration of $1\times10^{17}$ cm$^{-3}$ to $1\times10^{19}$ cm$^{-3}$. And the dopant concentration of the first body region 103a is suitably twice or more as high as that of the second body region 103b. In this case, the dopant concentrations of the first and second body regions 103a and 103b are compared to each other where the first and second body regions 103a and 103b are adjacent to each other.

On top of that, in this semiconductor element 100, the second silicon carbide semiconductor layer 106 is arranged on the doped region 104 and the JFET region 102j. In other words, the second silicon carbide semiconductor layer 106 is in contact with the upper surface of the drift region 102. That is why the amount of current to flow through the channel diode when a negative voltage is applied to the second ohmic electrode 110 (i.e., if the second ohmic electrode 110 is reverse biased) with respect to the first ohmic electrode 109 can be comparable to that of the ON-state current to flow through the transistor when a positive voltage is applied to the second ohmic electrode 110 (i.e., if the second ohmic electrode 110 is forward biased) with respect to the first ohmic electrode 109. Specifically, the amount of the former current can be at least one-fifth, and at most twice, as large as that of the rated ON-state current of the transistor. For example, if the ON state current of the transistor is 15 A (at Vds=1 V) when Vgs=15 V, the amount of the channel diode current to flow becomes approximately 15 A (at Vds=−2 V) when Vgs=0 V. Consequently, even if the second ohmic electrode 110 is supplied with a negative voltage (i.e., reverse-biased) with respect to the first ohmic electrode 109, the amount of current flowing through the body diode that is formed between the second body region 103b and the drift region 102 can be reduced significantly (and even to zero). As a result, a lot of current can flow through the channel diode.

To conclude, in the semiconductor element 100 of this embodiment, the free-wheeling inverse diode connected antiparallel to a MISFET in a typical inverter circuit can be replaced by the channel diode of the semiconductor element 100. That is to say, the inverse diode can be built in the semiconductor element 100.

In addition, the absolute value of the turn-on voltage Vf0 of the channel diode can be smaller than that of the turn-on voltage of the body diode, and therefore, the power loss caused by the inverter circuit can be cut down. Furthermore, since the amount of current flowing through the body diode can be reduced considerably, the decline in the crystallinity of the semiconductor element 100 can be minimized and its high breakdown voltage characteristic can be maintained. Consequently, this semiconductor element 100 ensures high reliability.

Furthermore, according to this embodiment, since the dopant concentration of the dopant of the second conductivity type is lower in the doped region 104 than in the first body region, the dose of the dopant of the first conductivity type to be cancelled can be so small that a heavily doped region 104 of the first conductivity type can be formed easily. As a result, the sheet resistance of the doped region 104, and eventually the ON-state resistance of the semiconductor element 100, can be reduced.

Figure 2B:
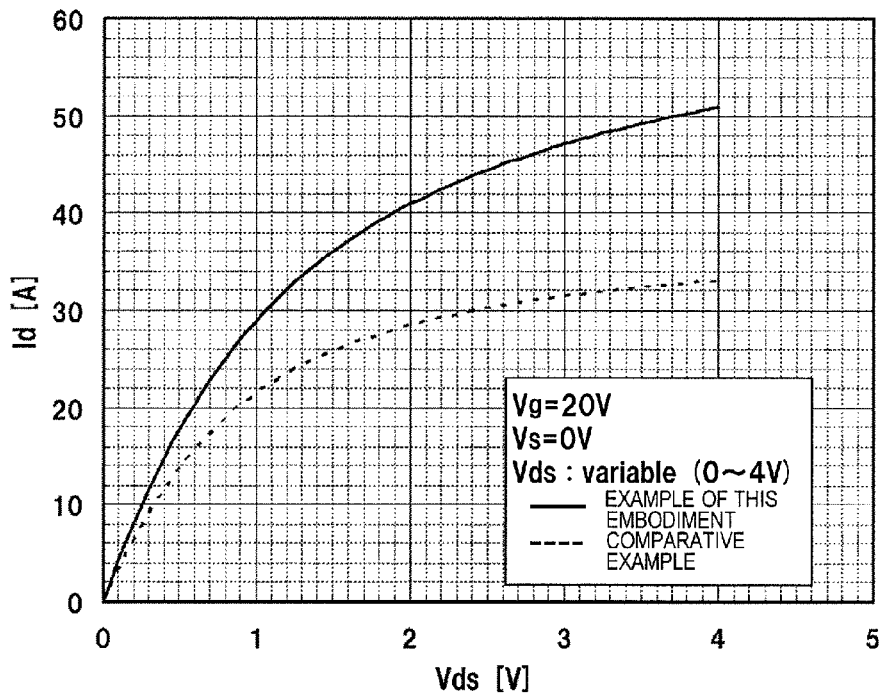
FIG. 2B is a graph showing an exemplary forward direction characteristic of a semiconductor element according to the first embodiment.
Figure 2C:
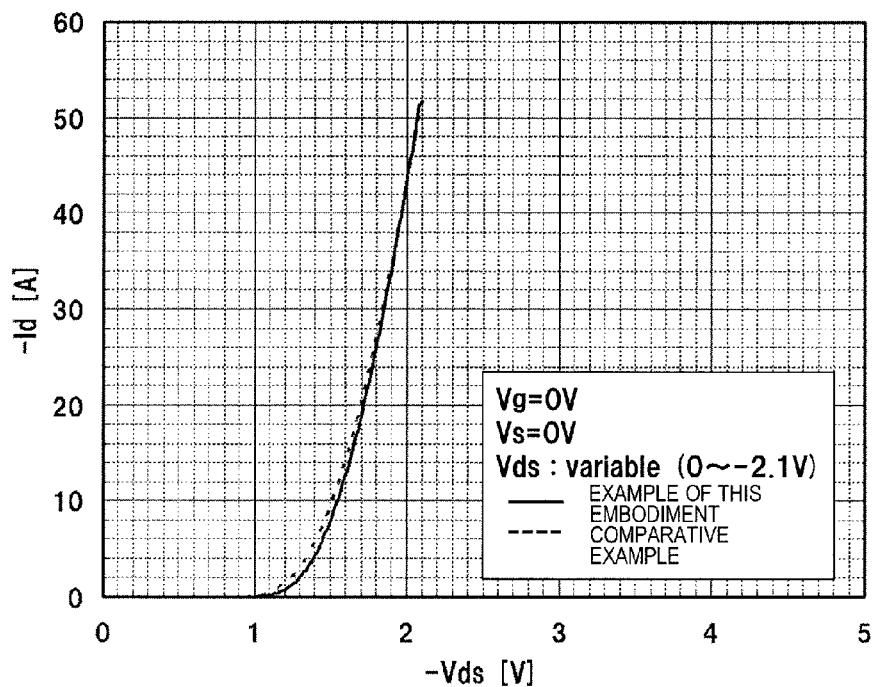
FIG. 2C is a graph showing an exemplary reverse direction characteristic of a semiconductor element according to the first embodiment.

FIGS. 2B and 2C show the transistor characteristics of a semiconductor element 100 as an example of this embodiment. Specifically, the forward direction and reverse direction characteristics of the semiconductor element 100 are shown in FIGS. 2B and 2C, respectively. For the purpose of comparison, the characteristic of the conventional semiconductor element shown in FIG. 7 is also shown there.

As can be seen from FIG. 2B, the semiconductor element 100 of this example has so low ON-state resistance as to allow a sufficient amount of forward current to flow. In the example shown in FIG. 2B, the doped regions 104 of the specific example of this embodiment and the comparative example had a sheet resistance of 1.7 kΩ/□ and a sheet resistance of 12.56 kΩ/□, respectively. That is to say, according to this embodiment, the sheet resistance could be reduced to one seventh compared to the conventional semiconductor element. Also, as can be seen from FIG. 2C, when a reverse bias was applied, source-drain current flowed in the reverse direction. Thus, it can be seen that the semiconductor element 100 of this embodiment functions as an inverse diode, too.

Hereinafter, it will be described with reference to FIGS. 3A, 3B, 4 and 5 how to fabricate the semiconductor element 100 of this embodiment. First of all, a semiconductor substrate 101 is provided. The semiconductor substrate 101 may be a low-resistance n-type 4H-SiC off-axis cut substrate (with a resistivity of 0.02 Ωcm), for example.

Figure 3A:
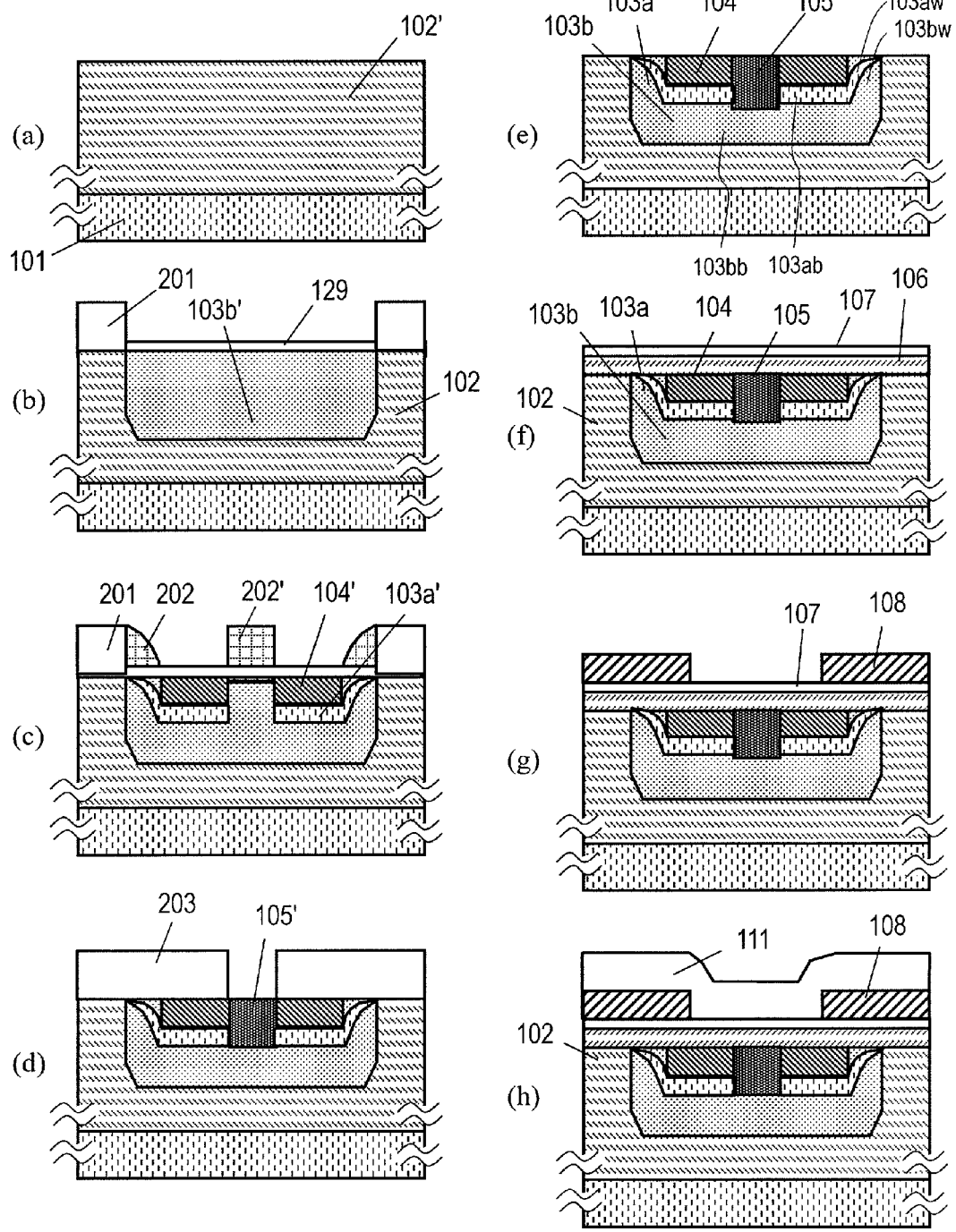
FIGS. 3A(a) through 3A(h) are cross-sectional views illustrating a series of manufacturing process steps to fabricate the semiconductor element 100.

Next, as shown in portion (a) of FIG. 3A, a first silicon carbide semiconductor layer 102' with high resistance is grown epitaxially on the semiconductor substrate 101. Before the first silicon carbide semiconductor layer 102' is formed, a buffer layer made of SiC with a high dopant concentration may be deposited on the semiconductor substrate 101. The buffer layer may have a dopant concentration of $1\times10^{18}$ cm$^{-3}$ and a thickness of 1 µm, for example. The first silicon carbide semiconductor layer 102' may be made of n-type 4H—SiC and may have a dopant concentration of $1\times10^{16}$ cm$^{-3}$ and a thickness of 10 µm, for example.

Thereafter, as shown in portion (b) of FIG. 3A, a base oxide film 129 is deposited to a thickness of 50 nm on the first silicon carbide semiconductor layer 102' and then mask 201 of SiN is formed thereon to have a thickness of 350 nm. This mask 201 will eventually define the body region 103. Through this mask 201, Al ions, for example, are implanted into the first silicon carbide semiconductor layer 102'. The ion implanted region thus formed is a second body implanted region 103b' with a lower concentration than a first body implanted region 103a'.

Subsequently, as shown in portion (c) of FIG. 3A, without removing the mask 201 after the ions have been implanted, another mask of SiO$_2$, for example, is deposited to a thickness of 500 nm and then etched back, thereby forming a sidewall 202 on the side surface of the mask 201 and a mask 202' that covers a portion of the first silicon carbide semiconductor layer 102' to be a contact region 105. Next, through the mask 201 with the sidewall 202, nitrogen ions, for example, are implanted into the second body implanted region 103b', thereby forming a dopant implanted region 104'. Subsequently, Al ions, for example, are implanted through the same mask, thereby forming a first body implanted region 103a'.

When the ions implanted are activated, the first body implanted region 103a', the second body implanted region 103b' and the dopant implanted region 104' will be the first body region 103a, the second body region 103b and the doped region 104, respectively. Also, the rest of the first silicon carbide semiconductor layer 102' other than the first and second body regions 103a, 103b and the doped region 104 will be the drift region 102.

Strictly speaking, the dopant concentration is different from the ion implantation profile, and the dopant concentration is often lower than the ion implantation profile. This depends on the rate of activation of the dopant introduced. For example, if the rate of activation is 100%, the ion implantation profile becomes substantially identical with the dopant concentration. Supposing the rate of activation is α%, the dose of the ion implantation process may be multiplied by $1/(\alpha/100)$ so that the dopant concentration intended can be obtained.

If Al is selected as an implant species as is done in this embodiment, Al has so small a diffusion coefficient in silicon carbide that a variation in concentration profile due to diffusion is almost negligible. On the other hand, if boron is used as a dopant to be introduced into the body region 103, then the rate of activation and the diffusion coefficient need to be obtained in advance and the ion implant energy and implant dose need to be set so as to obtain a desired dopant concentration profile. In the following description, the rate of activation is supposed to be 100%, and the dopant concentration and the ion implantation profile are supposed to be substantially the same.

The second body implanted region 103b' can be obtained by implanting Al ions with the following combinations of implant energies and doses:

30 keV: $6.0 \times 10^{12}$ cm$^{-2}$,
70 keV: $1.2 \times 10^{13}$ cm$^{-2}$,
150 keV: $2.5 \times 10^{13}$ cm$^{-2}$ and
350 keV: $6.0 \times 10^{13}$ cm$^{-2}$.

On the other hand, the first body implanted region 103a' to be formed using the mask 202' and the mask 201 with the sidewall 202 can be obtained by implanting Al ions with the following combination of implant energy and dose:
250 keV: $5.0 \times 10^{14}$ cm$^{-2}$ The dopant implanted region 104' can be obtained by implanting nitrogen ions with the following combinations of implant energies and doses:

30 keV: $1.5 \times 10^{14}$ cm$^{-2}$,
50 keV: $2.0 \times 10^{14}$ cm$^{-2}$, and
90 keV: $5.0 \times 10^{14}$ cm$^{-2}$ The doped region 104 in the second body region 103b comes to have a thickness of approximately 200 nm. The range from the surface to the depth of 200 nm becomes an n-type region, and the range deeper than 200 nm becomes a p-type region.

The first body region 103a to be formed using the mask 202' and the mask 201 with the sidewall 202 comes to have an ion implantation range Rp of 250 nm in an exposed area not covered with the sidewall 202 and an implant depth of 210 nm when the ion implantation range and a variation in ion implantation range (Rp−3×Δ Rp) are taken into account. Thus, the first body region 103a becomes deeper than the boundary between the second body region 103b and the doped region 104. That is to say, the ions to be implanted to form the first body implanted region 103a' are not introduced into the dopant implanted region 104' (or introduced at 0.3% or less of the implant dose) and do not affect the concentration of the dopant implanted region 104'.

On the other hand, where the surface is covered with the sidewall 202, the sidewall 202 serves as an implantation mask to make the implantation profile shallower. Nevertheless, the ion implantation range of the first body implanted region 103' is entirely included in the first silicon carbide semiconductor layer 102 and never remains in the mask 201 or the sidewall 202. Also, the thicker the sidewall 202, the shallower the ion implantation range of the first body implanted region 103a'. That is why the ion implantation range of the first body implanted region 103a' gets deeper the closer to the dopant implanted region 104', and gets shallower the closer to the drift region 102 (e.g., becomes as shallow as approximately 30 nm in the vicinity of the drift region 102).

In this manner, the first body region 103a is defined in the second body region 103b between the drift region 102 and the doped region 104.

Supposing the rate of activation is 100% as described above, the dopant concentrations of the first and second body implanted regions 103a' and 103b' will be at most about $1 \times 10^{19}$ cm$^{-3}$ and about $2 \times 10^{18}$ cm$^{-3}$, respectively. If the rate of activation is 100%, then these values become the maximum dopant concentrations of the first and second body regions 103a and 103b. Also, their average dopant concentrations are about $9.7 \times 10^{18}$ cm$^{-3}$ and about $1.5 \times 10^{18}$ cm$^{-3}$, respectively.

The dopant concentration of the first body region 103a is suitably at least twice, and at most 100 times, as high as the dopant concentration of the second body region 103b. In this embodiment, $2 \times 10^{18}$ cm$^{-3}$ or more and $5 \times 10^{17}$ cm$^{-3}$ or more are based on the dopant concentration S in the vicinity of the boundary between the first and second body regions 103a and 103b. Specifically, S is defined to be $1 \times 10^{18}$ cm$^{-3}$ and the regions where the dopant concentrations are calculated are defined to be a region where the dopant concentration is S×2 or more and a region where the dopant concentration is S/2 or more, respectively.

The thickness (depth) of the first body region 103a is determined by the turn-on voltage Vf0 of the channel diode, the concentration and thickness of the second silicon carbide semiconductor layer 106, and the thickness of the gate insulating film. When 0 V is applied to the gate electrode 108, the depletion layer that expands from the interface between the second silicon carbide semiconductor layer 106 and the first body region 103a toward the first body region 103a just needs to remain within the first body region 103a. For that purpose, the thickness of the first body region 103a needs to be 15 nm or more. Meanwhile, the thickness of the second body region 103b needs to be 100 nm or more.

It should be noted that the first body implanted region 103a', the second body implanted region 103b' and the dopant implanted region 104' do not always have to be formed in this order as in the example described above. Alternatively, the first body implanted region 103a' and the dopant implanted region 104' may be formed before the second body implanted region 103b'. Specifically, as shown in portion (a) of FIG. 3B, after a first silicon carbide semiconductor layer 102' with high resistance has been epitaxially grown on the semiconductor substrate 101, a base oxide film 129 is formed on the first silicon carbide semiconductor layer 102'. And a mask 201, a sidewall 202 and a mask 202' to define a contact region 105 are formed.

Figure 3B:
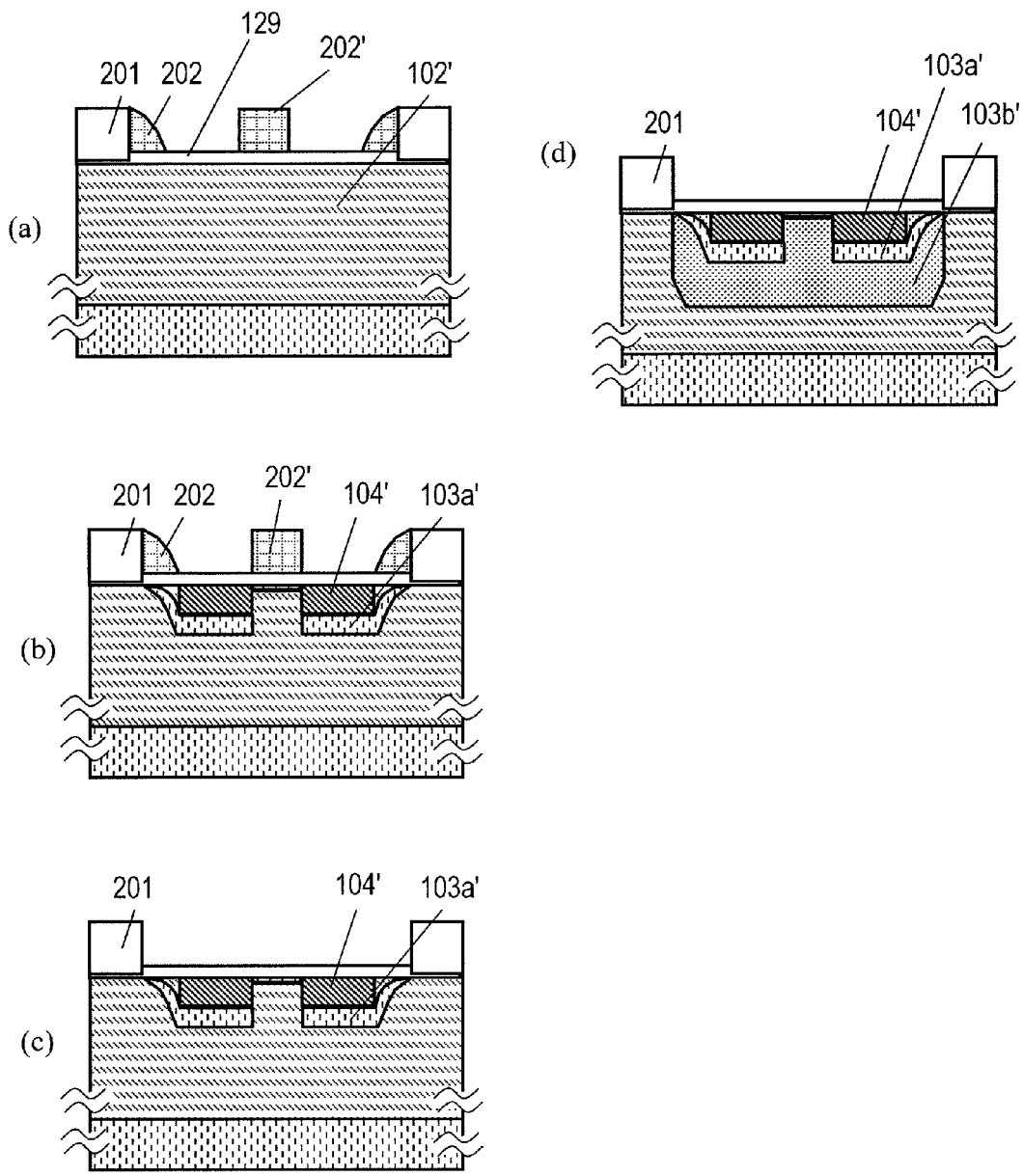
FIGS. 3B(a) through 3B(d) are cross-sectional views illustrating an alternative series of manufacturing process steps to fabricate the semiconductor element 100.
Figure 4:
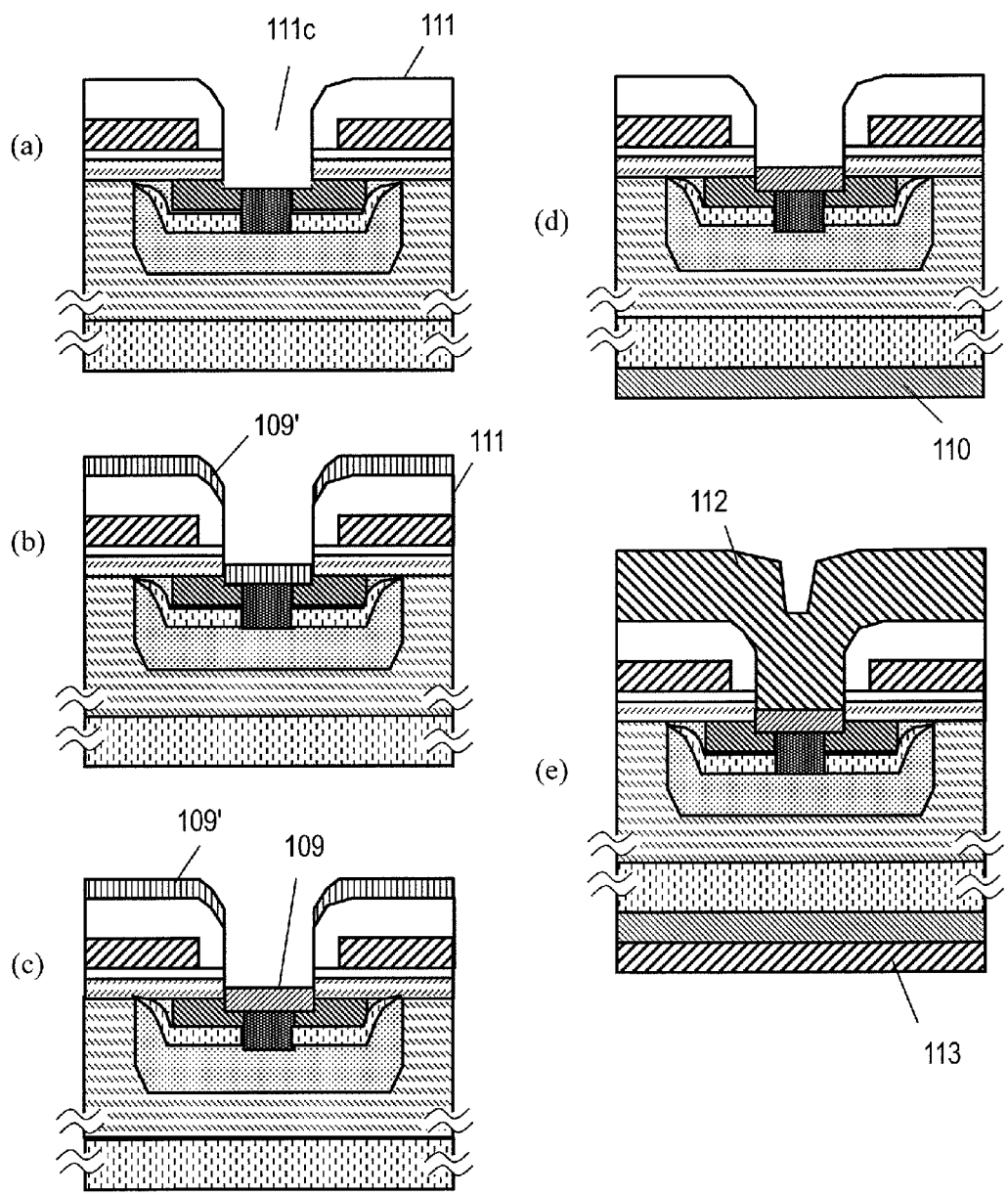
FIGS. 4(a) through 4(e) are cross-sectional views illustrating respective manufacturing process steps to fabricate the semiconductor element 100.
Figure 5:
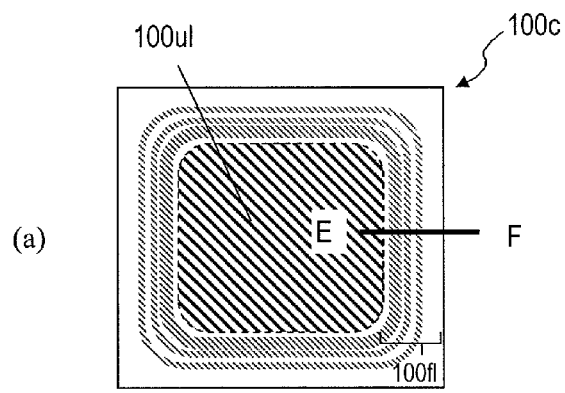
FIG. 5(a) is a top view illustrating a semiconductor device.
FIG. 5(b) is a cross-sectional view of a unit cell 100u thereof.
FIG. 5(c) is a cross-sectional view as viewed on the plane E-F shown in FIG. 5(a).
Figure 5:
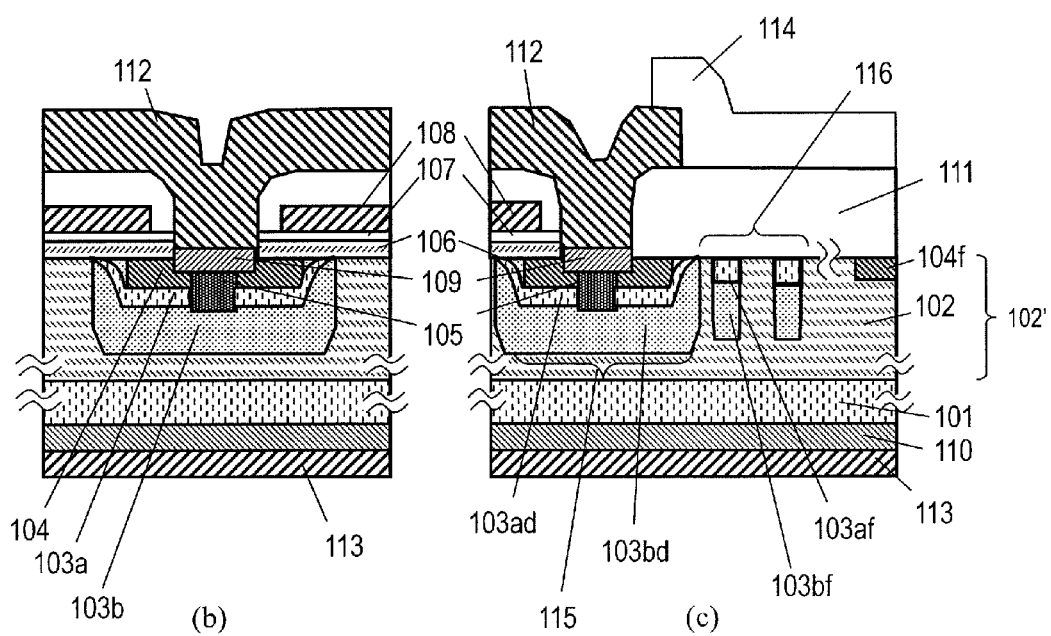

Next, as shown in portion (b) of FIG. 3B, nitrogen ions are implanted into the first silicon carbide semiconductor layer 102' through the mask 201, the sidewall 202 and the mask 202', thereby forming a dopant implanted region 104'. Also, by implanting Al ions into the first silicon carbide semiconductor layer 102', a first body implanted region 103a' is formed.

Then, as shown in portion (c) of FIG. 3B, the sidewall 202 and the mask 202' are removed.

Subsequently, as shown in portion (d) of FIG. 3B, Al ions, for example, are implanted into the first silicon carbide semiconductor layer 102' through the mask 201, thereby forming a second body implanted region 103b'.

Next, after the ions have been implanted, the masks 202, 202' and 201 are removed. And still another mask 203 is provided and ions of Al are implanted through it, thereby defining a contact implanted region 105' as shown in portion (d) of FIG. 3A. In this case, the contact implanted region 105' may reach the second body implanted region 103b'.

After these ions have been implanted, the mask 203 is removed and an annealing process is carried out to activate those ions, thereby defining first and second body regions 103a and 103b, a doped region 104 and a contact region 105 as shown in portion (e) of FIG. 3A. The ion implantation profile is determined so that the first body region 103a has a depth of 300 nm, for example, and the average dopant concentration becomes approximately $1\times10^{19}$ $cm^{-3}$. Also, the ion implantation profile is adjusted so that the body region 103, which is comprised of the first and second body regions 103a and 103b in combination, has an overall depth of 550 nm, for example, and the second body region 103b has an average dopant concentration of about $2\times10^{18}$ $cm^{-3}$ and that the doped region 104 has a depth of 250 nm, for example, and an average dopant concentration of about $5\times10^{19}$ $cm^{-3}$. In this case, the depth (i.e., the bottom level) of the first body region 103a is determined by a depth at which the body region 103 has a local minimum Al dopant concentration and the depth of the second body region 103b is supposed to be a depth at which a dopant concentration of $5\times10^{17}$ $cm^{-3}$ is obtained. On the other hand, the depth of the doped region 104 is supposed to be a depth at which a dopant concentration of $5\times10^{17}$ $cm^{-3}$ is obtained.

The contact region 105 may have a depth of 400 nm and an average dopant concentration of about $1\times10^{20}$ $cm^{-3}$. And its depth is supposed to be a depth at which a dopant concentration of $5\times10^{17}$ $cm^{-3}$ is obtained. It should be noted that in order to clean the surface of the first silicon carbide semiconductor layer 102' that has been subjected to annealing for activation, a surface portion of the first silicon carbide semiconductor layer 102' is sometimes removed. For example, if a surface portion of the first silicon carbide semiconductor layer 102' has been removed to a depth of 50 nm, the respective depths of the first body region 103a, the overall body region 103, the doped region 104 and the contact region 105 will all decrease by about 50 nm to 250 nm, 500 nm, 200 nm and 350 nm, respectively.

Next, as shown in portion (f) of FIG. 3A, a second silicon carbide semiconductor layer 106 is grown epitaxially over the entire surface of the first silicon carbide semiconductor layer 102' including the first body region 103a, the doped region 104 and the contact region 105. In this embodiment, the dopant concentration N ($cm^{-3}$) and thickness d (nm) of the second silicon carbide semiconductor layer 106 are adjusted so as to satisfy the following condition:

$N=2\times10^{18}$ $d=30$

Subsequently, a predetermined portion of the second silicon carbide semiconductor layer 106 is dry-etched away and then a gate insulating film 107 may be formed on the surface of the second silicon carbide semiconductor layer 106 by thermal oxidation, for example. If the gate insulating film 107 is formed by thermal oxidation, a portion of the second silicon carbide semiconductor layer 106 will form part of the gate insulating film 107. That is why the thickness of the second silicon carbide semiconductor layer 106 needs to be adjusted with the thickness to be lost through the thermal oxidation taken into account so that the second silicon carbide semiconductor layer 106 will have the thickness d after the gate insulating film 107 has been formed. In this example, the second silicon carbide semiconductor layer 106 may be deposited to a thickness that is approximately 50 nm greater than the thickness d and its thickness will decrease to that thickness d by going through the process step of cleaning the surface of the second silicon carbide semiconductor layer 106 before the gate insulating film is formed thereon and the process step of forming the gate insulating film. After that, a polysilicon film that has been doped with phosphorus to about $7\times10^{20}$ $cm^{-3}$ is deposited on the surface of the gate insulating film 107. The polysilicon film may have a thickness of about 500 nm.

Thereafter, as shown in portion (g) of FIG. 3A, the polysilicon film is dry-etched using a mask (not shown), thereby forming a gate electrode 108 in an intended area. Then, as shown in portion (h) of FIG. 3A, an interlevel dielectric film 111 of $SiO_2$, for example, is deposited to a thickness of 1.5 μm, for example, by CVD process over the respective surfaces of the gate electrode 108 and the first silicon carbide semiconductor layer 102'.

Next, as shown in FIG. 4(a), a portion of the interlevel dielectric film 111 is dry-etched away through a mask (not shown) from over the surface of the contact region 105 and the surface of a part of the doped region 104, thereby cutting a contact hole 111c through it.

Subsequently, as shown in FIG. 4(b), a nickel film 109' is deposited to a thickness of about 50 nm on the interlevel dielectric film 111. Then, as shown in FIG. 4(c), a heat treatment is carried out at 950° C., for example, for five minutes within an inert ambient, thereby making the nickel film 109' react with the surface of silicon carbide and forming a first ohmic electrode 109 of nickel silicide. After that, as shown in FIG. 4(d), the nickel film 109' on the interlevel dielectric film 111 is etched away and then nickel, for example, is deposited over the entire back surface of the semiconductor substrate 101, too, and then made to react with silicon carbide through a heat treatment in the same way, thereby forming a second ohmic electrode 110 there.

Next, an aluminum film is deposited to a thickness of about 4 μm to cover the interlevel dielectric film 111 and to fill the contact hole 111c. It is then etched into a predetermined pattern, forming an upper interconnect electrode 112 as shown in FIG. 4(e). Although not shown, a gate line (or gate pad) to contact with the gate electrode is also formed somewhere else at an end of the chip. Furthermore, Ti/Ni/Ag films for use to make die bonding may be deposited in this order on the back surface of the second ohmic electrode 110 to form a back surface interconnect electrode 113. In this case, the Ti film contacts with the second ohmic electrode 110. In this manner, the semiconductor element 100 shown in FIG. 1 can be obtained.

The semiconductor element 100 of this embodiment includes first and second body regions with mutually different concentrations and can control independently of each other the second body region that affects the breakdown voltage of the element and the first body region that affects the threshold voltage Vth of the transistor and the turn-on voltage Vf0 of the channel diode. As a result, the channel diode can be used as an inverse diode and a highly reliable semiconductor element with a high breakdown voltage can be provided. In addition, when the first body region to control the threshold value is formed, no dopant ions of the second conductivity type are implanted into a region to be a doped region of the first conductivity type (i.e., a source region). That is why the doped region of the first conductivity type can be formed without implanting dopant ions of the opposite conductivity type. As a result, the decrease in the concentration of the doped region of the first conductivity type can be minimized and its variation can be reduced as well. Consequently, a low-resistance doped region of the first conductivity type can be formed just as intended, an increase in the ON-state resistance of the semiconductor element can be checked, and a variation in its characteristic can be minimized.

In order to decrease the turn-on voltage |Vf0| of the channel diode (to 1 V or less to say the least, and to 0.6 V if possible) while keeping the breakdown voltage of the element high enough and to maintain a positive threshold voltage with (which suitably falls within the range of 2 V through 8 V) for the transistor, the dopant concentration of the second body region may be lower than that of the first body region. In this case, the dopant concentrations of the first and second body regions are compared to each other at the same depth level in the first silicon carbide semiconductor layer. If the turn-on voltage of the channel diode is set to be 1 V or less, the Schottky diode of SiC, which is a candidate for an inverse diode, can be replaced. And if the turn-on voltage of the channel diode is set to be 0.6 V or less, a fast recovery diode of Si can be replaced. That is to say, the semiconductor element 100 can also function as an inverse diode by itself, and therefore, there is no need to use any of these inverse diodes anymore. Furthermore, the threshold voltage Vth of the forward current may be 2 V or more. A semiconductor element (which is typically a MISFET) to be ordinarily used in an inverter circuit that is a power circuit may be normally OFF (i.e., Vth>0V). This is because even if the gate controller went out or order and the gate voltage went 0 V for some reason, the drain current could still be shut off safely in that case. Also, the higher the temperature, the lower the threshold voltage of a MISFET tends to be. For example, in the case of an SiC-MISFET, a rise in temperature of 100° C. could cause a decrease of approximately 1 V. In this case, supposing the noise margin is 1 V in order to prevent the gate from being turned ON accidentally due to noise, Vth at room temperature may be set to be equal to or higher than 2 V (=1 V+1 V). Also, if the threshold voltage were too high, the gate voltage to be applied to turn the transistor ON would increase accordingly, and a lot of constraints would be imposed on the power supply to generate the gate voltage. For that reason, the threshold voltage may be set to be 8 V or less in practice.

On top of that, by setting the dopant concentration of the second body region to be lower than that of the first body region, a process for making a structure that reduces an overconcentration of an electric field around the periphery of a semiconductor element can be designed more easily. Hereinafter, this respect will be described.

FIG. 5(a) is a schematic representation illustrating a part of a semiconductor device 100c, including a number of semiconductor elements 100 as unit cells, as viewed from over the upper interconnect electrode 112. As shown in FIG. 5(a), the semiconductor element 100 is often diced into a quadrilateral shape. The semiconductor device 100c includes a unit cell arrangement portion 100ul and a peripheral portion 100fl. In the unit cell arrangement portion 100ul, arranged is the unit cell shown in FIGS. 1(b) and 1(c). The peripheral portion 100fl is arranged so as to surround the unit cell arrangement portion 100ul. FIG. 5(b) shows the unit cell 100u of the semiconductor element 100 that is already shown in FIG. 1(a). FIG. 5(c) is a cross-sectional view of the device as viewed on the plane E-F shown in FIG. 5(a). The semiconductor device 100c includes an implanted region 115 of the second conductivity type, which is arranged in the peripheral portion 100fl. The implanted region 115 is arranged mostly on the outermost periphery of the unit cell 100u and is defined by the same planar shape as the unit cell 100u (e.g., the square shape shown in FIG. 1(b)). The semiconductor device further includes a ring region (FLR) 116 of the second conductivity type. On a plane that is parallel to the principal surface of the semiconductor substrate 101, the ring region 116 surrounds the unit cell arrangement portion 100ul and the implanted region 115 as a ring and may be made up of either a single ring or multiple rings. A depletion suppressing region 104f of the first conductivity type is further arranged outside of the ring region 116 and surrounds the ring region 116. The implanted region 115 and the ring region 116 play the role of reducing the overconcentration of an electric field at one end of the element by affecting the breakdown voltage of the element.

In order to reduce the overconcentration of the electric field at the periphery of the element, the implanted region 115 and the ring region 116, of which the conductivity type (i.e., p-type in this example) is opposite to that of the drift region 102 that is provided to have a predetermined breakdown voltage, may be provided. By forming the implanted region 115 and the ring region 116 while the body region 103 is being formed in the semiconductor element 100, the manufacturing process of the semiconductor device can be simplified and the process cost can be cut down as well. In FIG. 5(c), for example, in the process step of forming the first and second body implanted regions 103a' and 103b' shown in portions (b) and (c) of FIG. 3A during the manufacturing process of the semiconductor element 100, the implanted region 115 and the ring region 166 may also be formed at the same time.

Specifically, the first and second implanted regions 103ad and 103bd in the implanted region 115 can be formed by performing the same process steps as the first and second body regions 103a and 103b, respectively. In addition, the first and second ring regions 103af and 103bf in the ring region 116 can also be formed by performing the same process steps as the first and second body regions 103a and 103b, respectively. In this case, if the first ring region 103af is formed without covering the surface of the first silicon carbide semiconductor layer 102' with any mask, then the first ting region 103af will be located as deep as the first body region 103a below the doped region 104, i.e., under the surface of the first silicon carbide semiconductor layer 102'. To define the first ring region 103af in the vicinity of the surface of the first silicon carbide semiconductor layer 102', the surface of the first silicon carbide semiconductor layer 102' may be selectively covered with a mask that performs the same function as the sidewall 202 shown in portion (c) of FIG. 3A so that a dopant of the first conductivity type is implanted into a region of the first silicon carbide semiconductor layer 102' near its surface.

If the process design is facilitated by forming the first and second body regions in the unit cell arrangement portion 100ul and the implanted region 115 and the ring region 116 in the peripheral portion 100fl at the same time, the decrease in the breakdown voltage of the element can also be checked effectively. And in order to minimize the decrease in the breakdown voltage of the element, the overconcentration of an electric field at the peripheral portion 100fl needs to be reduced in one way or another. In this case, to reduce the overconcentration of the electric field successfully, it is important how to design the implanted region 115 and the ring region 116 of the element. For that purpose, the best width, interval, and number of the rings included in the ring region 116 and the best dopant concentration in the second ring region 103bf may be determined first, and based on that element design, a set of masks to carry out the semiconductor process is prepared. Since an electric field gets overly concentrated at a pn junction in most cases, the intensity of the electric field will often become excessively high at the respective bottoms of the second implanted region 103bd and the second ring region 103bf in the peripheral portion 100fl. In the semiconductor element 100 of this embodiment, the implanted region 115 and the ring region 116 of the peripheral portion 100fl can be formed at the same time with the first and second body regions 103a and 103b in the unit cell arrangement portion 100ul. In that case, while fixing the dopant concentrations of the second body region 103b, the second implanted region 103bd and second ring region 103bf that will affect the breakdown voltage of the element on the one hand and determining arbitrarily the dopant concentration of the first body region 103a through the process, the intended Vth and |Vf0| can be obtained with the decrease in the breakdown voltage of the element minimized. That is to say, even if the dopant concentration of the body region is changed, there is no need to modify the element design process (i.e., to remake masks). Instead, the flexibility of the process design can be increased without modifying the element design process.

INDUSTRIAL APPLICABILITY

According to an aspect of the present invention, provided is a semiconductor element that can minimize a decrease in breakdown voltage and an increase in leakage current while avoiding further decreasing the crystallinity of the semiconductor element including a pn junction of SiC.

REFERENCE SIGNS LIST 100 semiconductor element
101 semiconductor substrate
102 drift region
102' first silicon carbide semiconductor layer
102j JFET region
103a first body region
103b second body region
103ab, 103bb bottom portion
103aw, 103bw wall portion
104 doped region
105 contact region
106 second silicon carbide semiconductor layer
106c channel region
107 gate insulating film
108 gate electrode
109 first ohmic electrode
110 second ohmic electrode
111 interlevel dielectric film
112 upper interconnect electrode
113 back surface interconnect electrode

The invention claimed is:
1. A semiconductor element comprising:
a semiconductor substrate of a first conductivity type;
a first silicon carbide semiconductor layer of the first conductivity type, which is located on the principal surface of the semiconductor substrate;
a body region of a second conductivity type, which is located in the first silicon carbide semiconductor layer;
a doped region of the first conductivity type, which is located in the body region;
a second silicon carbide semiconductor layer of the first conductivity type, which is arranged on the first silicon carbide semiconductor layer so as to contact at least partially with the body region and the doped region;
a gate insulating film on the second silicon carbide semiconductor layer;
a gate electrode on the gate insulating film;
a first ohmic electrode which is electrically connected to the doped region; and
a second ohmic electrode which is arranged on the back surface of the semiconductor substrate, and
wherein the body region includes a first body region and a second body region, the second body region being arranged at least under the first body region and contacting with the bottom of the body region, and
wherein the first body region has a higher dopant concentration than the second body region, and
wherein the doped region includes the dopant of the second conductivity type at a lower concentration than the first body region, and
wherein a portion of the first body region that contacts with the second silicon carbide semiconductor layer is arranged shallower than another portion of the first body region that is located under the doped region, and
wherein each of the first and second body regions has a bottom portion and a wall portion, and
wherein in the first silicon carbide semiconductor layer, the doped region is located in a surface region of the first silicon carbide semiconductor layer,
the bottom portion of the first body region is located under the doped region, and
in a region of the first silicon carbide semiconductor layer under the gate electrode, the wall portion of the first body region is located beside the doped region and contacts with the surface of the first silicon carbide semiconductor layer, and
the bottom portion of the second body region is located under the bottom portion of the first body region and
in a region of the first silicon carbide semiconductor layer under the gate electrode, the wall portion of the second body region is located outside of the wall portion of the first body region.

2. The semiconductor element of claim 1, wherein the first and second body regions have thicknesses of 15 nm and 100 nm, respectively, as measured perpendicularly to the principal surface of the semiconductor substrate, and
wherein the dopant concentration of the first body region is twice or more as high as that of the second body region.

3. The semiconductor element of claim 1, wherein supposing potentials applied to the second ohmic electrode and the gate electrode are Vds and Vgs, respectively, with respect to the first ohmic electrode and a gate threshold voltage is Vth,
if Vgs Vth≥is satisfied, current flows from the second ohmic electrode toward the first ohmic electrode through the second silicon carbide semiconductor layer, and
if 0 volts≤Vgs <Vth is satisfied, as Vds decreases to be less than 0 volts, current flows from the first ohmic electrode toward the second ohmic electrode through the second silicon carbide semiconductor layer before current starts to flow from the body region toward the first silicon carbide semiconductor layer.

4. The semiconductor element of claim 1 claims, wherein the semiconductor substrate, the first silicon carbide semiconductor layer, the body region, the doped region, the second silicon carbide semiconductor layer, the gate insulating film, the gate electrode, the first ohmic electrode, and the second ohmic electrode together form a metal-insulator-semiconductor field effect transistor, and wherein supposing a potential of the second ohmic electrode with respect to the potential of the first ohmic electrode is Vds, a potential of the gate electrode with respect to the potential of the first ohmic electrode is Vgs, a gate threshold voltage of the metal-insulator-semiconductor field effect transistor is Vth, a direction of current flowing from the second ohmic electrode toward the first ohmic electrode is defined to be a forward direction, and a direction of current flowing from the first ohmic electrode toward the second ohmic electrode is defined to be a reverse direction, if Vgs≥Vth is satisfied, then the metal-insulator-semiconductor field effect transistor makes the second and first ohmic electrodes electrically conductive with each other via the second silicon carbide semiconductor layer, and if 0 volts≤Vgs <Vth is satisfied, then the metal-insulator-semiconductor field effect transistor functions as a diode which allows no current to flow in the forward direction but which allows current to flow in the reverse direction from the first ohmic electrode toward the second ohmic electrode via the second silicon carbide semiconductor layer when Vds <0 volts, and an absolute value of a turn-on voltage of the diode is smaller than an absolute value of a turn-on voltage of a body diode formed by the body region and the first silicon carbide semiconductor layer.

5. The semiconductor element of claim 1, wherein the first body region has a dopant concentration of $1\times10^{18}$ cm$^{-3}$ to $1\times10^{20}$ cm$^{-3}$ and the second body region has a dopant concentration of $1\times10^{17}$ cm$^{-3}$ to $1\times10^{19}$ cm$^{-3}$.

6. A semiconductor device comprising a plurality of the semiconductor elements of claim 1, wherein the respective semiconductor substrates and respective first silicon carbide semiconductor layers of the plurality of the semiconductor elements are connected together, and wherein a ring region of the second conductivity type is arranged in the first silicon carbide semiconductor layer so as to surround the plurality of the semiconductor elements in a plane that is parallel to the principal surface of the semiconductor substrate, and wherein the ring region and the body region have the same dopant concentration profile in a depth direction.

7. The semiconductor element of claim 1, wherein the second silicon carbide semiconductor layer is electrically connected to the doped region and a portion of the first silicon carbide semiconductor layer which is adjacent to the second body region and the second silicon carbide semiconductor layer is arranged on the first body region.

8. The semiconductor element of claim 7, wherein the second silicon carbide semiconductor layer has been epitaxially grown.

9. A method for fabricating a semiconductor element, the method comprising the steps of:

(A) forming a first silicon carbide semiconductor layer of a first conductivity type on a semiconductor substrate;

(B) forming a first mask to define a body region on the first silicon carbide semiconductor layer;

(C) forming a body implanted region in the first silicon carbide semiconductor layer by implanting a dopant of a second conductivity type using the first mask;

(D) forming a sidewall on side surfaces of the first mask;

(E) implanting a dopant of the first conductivity type using the first mask and the sidewall to define a dopant implanted region in the first silicon carbide semiconductor layer and implanting a dopant of the second conductivity type to define a first body implanted region in the first silicon carbide semiconductor layer; and (F) thermally treating the first silicon carbide semiconductor layer to turn the dopant implanted region and the first body implanted region into a doped region and a first body region, respectively, define a second body region in a portion of the body implanted region other than the dopant implanted region and the first body implanted region, and define a drift region in a portion of the first silicon carbide semiconductor layer other than the body implanted region, wherein in the step (E), the dopant of the second conductivity type is implanted so that the dopant of the second conductivity type is located deeper than the dopant implanted region in the body implanted region, and wherein each of the first and second body regions has a bottom portion and a wall portion, and wherein in the first silicon carbide semiconductor layer, the doped region is located in a surface region of the first silicon carbide semiconductor layer, the bottom portion of the first body region is located under the doped region and the wall portion of the first body region is located beside the doped region and contacts with the surface of the first silicon carbide semiconductor layer, and the bottom portion of the second body region is located under the bottom portion of the first body region and the wall portion of the second body region is located outside of the wall portion of the first body region.

10. The method for fabricating a semiconductor element of claim 9, further comprising, before the step (F), the step of forming a contact implanted region that at least reaches the bottom portion of the first body region in the dopant implanted region, and wherein the step (F) includes turning the contact implanted region into a contact region.

11. The method for fabricating a semiconductor element of claim 10, further comprising, after the step (F), the steps of:

forming a second silicon carbide semiconductor layer on the surface of the first silicon carbide semiconductor layer;

forming a gate insulating film on the second silicon carbide semiconductor layer;

forming a gate electrode on the gate insulating film;

removing respective parts of the gate insulating film and the second silicon carbide semiconductor layer so that a part of the doped region and the contact region are exposed;

forming a first ohmic electrode so that the first ohmic electrode contacts with the exposed part of the doped region and with the contact region; and forming a second ohmic electrode in contact with the other surface of the semiconductor substrate with which the first silicon carbide semiconductor layer does not contact.

12. The method for fabricating a semiconductor element of claim 9, wherein the steps (A), (B), (D), (E), (C) and (F) are performed in this order, and wherein the method further includes, between the steps (E) and (C), the step of removing the sidewall.

* * * * *